（12）United States Patent
Nakanishi

(10) Patent No.: US 11,009,804 B2
(45) Date of Patent: May 18, 2021

(54) SEMICONDUCTOR LIGHT-EMITTING DEVICE, EXPOSURE HEAD, AND IMAGE FORMING APPARATUS

(71) Applicant: CANON KABUSHIKI KAISHA, Tokyo (JP)

(72) Inventor: Koichiro Nakanishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/815,405

(22) Filed: Mar. 11, 2020

(65) Prior Publication Data

US 2020/0292958 A1 Sep. 17, 2020

(30) Foreign Application Priority Data

Mar. 12, 2019 (JP) .............................. JP2019-044642

(51) Int. Cl.
*G03G 15/04* (2006.01)
*H01L 33/00* (2010.01)

(52) U.S. Cl.
CPC ... *G03G 15/04054* (2013.01); *H01L 33/0016* (2013.01); *G03G 2215/0409* (2013.01)

(58) Field of Classification Search
CPC ....... G03G 15/04054; G03G 15/04063; G03G 2215/0409; H01L 33/0012; H01L 33/0016
See application file for complete search history.

(56) References Cited

FOREIGN PATENT DOCUMENTS

JP     2007250853 A    9/2007
JP     2017-174907 A * 9/2017

OTHER PUBLICATIONS

Co-pending U.S. Appl. No. 16/835,480, filed Mar. 31, 2020.

\* cited by examiner

*Primary Examiner* — Hoang X Ngo
(74) *Attorney, Agent, or Firm* — Venable LLP

(57) ABSTRACT

Provided is a semiconductor light-emitting device including a plurality of nodes and a plurality of transfer diodes connecting the nodes, and gates of a shift thyristor and a light-emitting thyristor are connected to each of the nodes. Each of the transfer diodes includes a stacked structure including a first semiconductor layer of a first conductivity type provided over a semiconductor substrate, a second semiconductor layer of a second conductivity type, which is different from the first conductivity type, provided over the first semiconductor layer, a third semiconductor layer of the first conductivity type provided over the second semiconductor layer, a fourth semiconductor layer of the second conductivity type provided over the third semiconductor layer, and a fifth semiconductor layer of the first conductivity type provided over the fourth semiconductor layer, and a diode is formed by a p-n junction between the fourth and fifth semiconductor layers.

15 Claims, 14 Drawing Sheets

SEMICONDUCTOR LIGHT-EMITTING DEVICE, EXPOSURE HEAD, AND IMAGE FORMING APPARATUS

BACKGROUND OF THE INVENTION

Field of the Invention

The present invention relates to a semiconductor light-emitting device, an exposure head, and an image forming apparatus.

Description of the Related Art

As an exposure head used for forming a latent image on a photosensitive drum of an image forming apparatus, a surface light-emitting element array is used. In a typical configuration of such an exposure head, a plurality of plane light-emitting elements (light-emitting elements that emit light perpendicular to the primary face of a semiconductor substrate) are aligned in a certain direction, and a lens array is arranged in the same direction as the alignment direction of light-emitting elements. The light from the light-emitting elements are then captured on the photosensitive drum through the lens. As a light-emitting element, an element formed of a light-emitting diode (LED) and an element formed of a light-emitting thyristor are known.

Japanese Patent Application Laid-Open No. 2007-250853 discloses a self-scanning light-emitting element array using a light-emitting thyristor. In the self-scanning light-emitting element array disclosed in Japanese Patent Application Laid-Open No. 2007-250853, shift unit thyristors are coupled by a coupling diode, thereby a potential gradient is formed between the gates of the shift unit thyristors, and a self-scanning function is realized by using a threshold voltage difference between the shift unit thyristors.

In such a conventional self-scanning light-emitting element array using light-emitting thyristors, however, it is not possible to form a predetermined potential gradient between the gates of shift unit thyristors, and this may cause a malfunction in a transfer operation.

SUMMARY OF THE INVENTION

The present invention intends to provide a semiconductor light-emitting device, an exposure head, and an image forming apparatus that can stabilize a transfer operation of a self-scanning circuit.

According to one aspect of the present invention, provided is a semiconductor light-emitting device including a plurality of nodes and a plurality of transfer diodes connecting the plurality of nodes, and a gate of a shift thyristor and a gate of a light-emitting thyristor are connected to each of the plurality of nodes. Each of the plurality of transfer diodes includes a stacked structure including a first semiconductor layer of a first conductivity type provided over a semiconductor substrate, a second semiconductor layer of a second conductivity type, which is different from the first conductivity type, provided over the first semiconductor layer, a third semiconductor layer of the first conductivity type provided over the second semiconductor layer, a fourth semiconductor layer of the second conductivity type provided over the third semiconductor layer, and a fifth semiconductor layer of the first conductivity type provided over the fourth semiconductor layer, and a diode is formed by a p-n junction between the fourth semiconductor layer and the fifth semiconductor layer.

Further, according to another aspect of the present invention, provides is a semiconductor element including a stacked structure including a first semiconductor layer of a first conductivity type provided over a semiconductor substrate, a second semiconductor layer of a second conductivity type, which is different from the first conductivity type, provided over the first semiconductor layer, a third semiconductor layer of the first conductivity type provided over the second semiconductor layer, a fourth semiconductor layer of the second conductivity type provided over the third semiconductor layer, and a fifth semiconductor layer of the first conductivity type provided over the fourth semiconductor layer, and the semiconductor element is formed by a p-n junction between the fourth semiconductor layer and the fifth semiconductor layer.

Further, according to yet another aspect of the present invention, provided is a semiconductor element including a first semiconductor layer of a first conductivity type provided over a semiconductor substrate, a second semiconductor layer of a second conductivity type, which is different from the first conductivity type, provided over the first semiconductor layer, a third semiconductor layer of the first conductivity type provided over the second semiconductor layer, a fourth semiconductor layer of the second conductivity type provided over the third semiconductor layer, a fifth semiconductor layer of the first conductivity type provided over the fourth semiconductor layer, a first electrode connected to the fifth semiconductor layer, and a second electrode connected to the fourth semiconductor layer.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
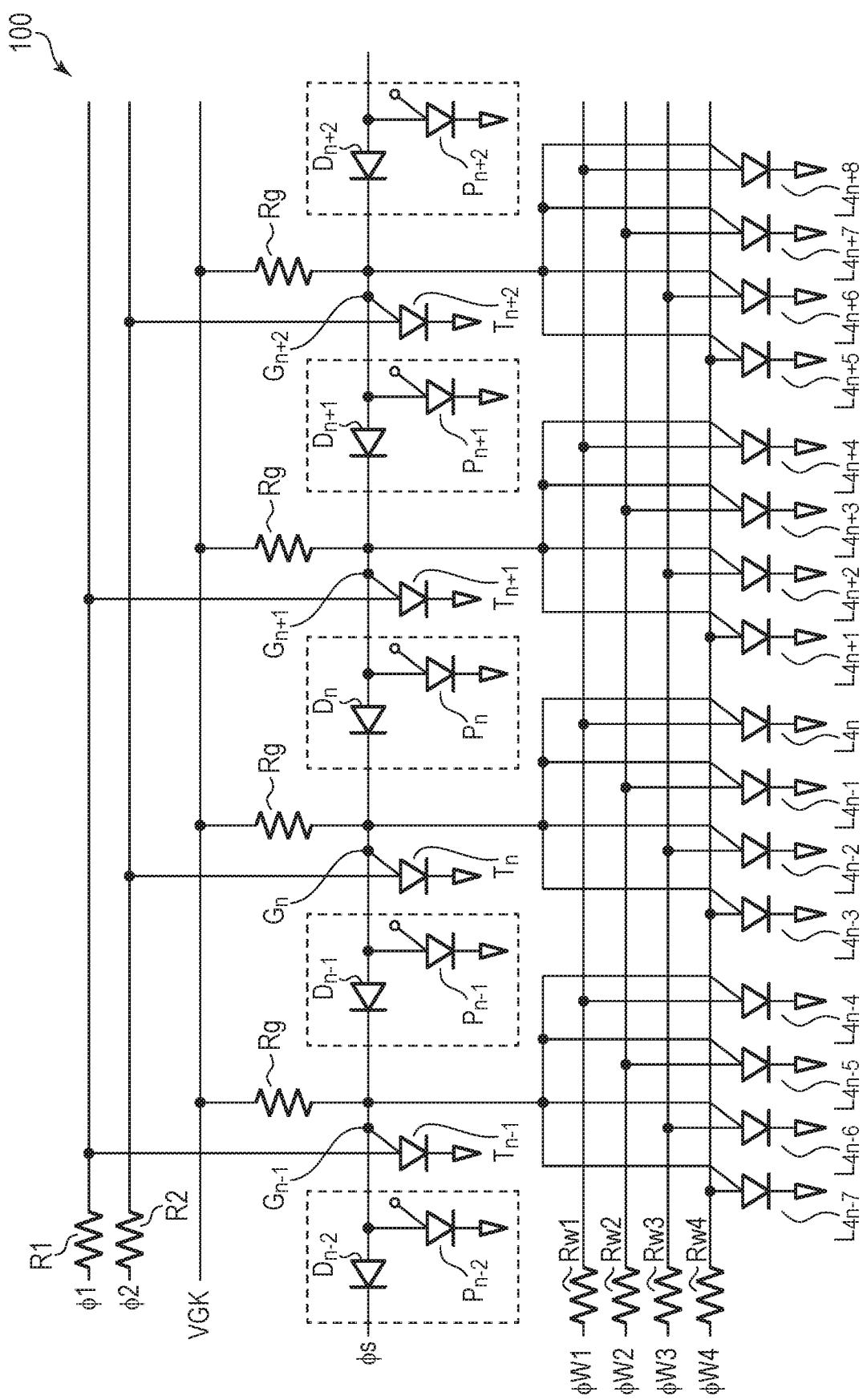
FIG. 1 is an equivalent circuit diagram illustrating a general configuration of a semiconductor light-emitting device according to a first embodiment of the present invention.

A general configuration of a semiconductor light-emitting device according to a first embodiment of the present invention will be described with reference to FIG. 1. FIG. 1 is an equivalent circuit diagram illustrating the general configuration of the semiconductor light-emitting device according to the present embodiment.

As illustrated in FIG. 1, a semiconductor light-emitting device 100 according to the present embodiment includes a plurality of shift thyristors T, a plurality of transfer diodes D, and a plurality of light-emitting thyristors L. A parasitic thyristor P is connected to each of the plurality of transfer diodes D.

The semiconductor light-emitting device 100 according to the present embodiment is a self-scanning light-emitting device (SLED) using diode coupling. While the self-scanning light-emitting device may be a device using a light-emitting diode (LED) or a vertical cavity surface emitting laser (VCSEL), a light-emitting device using a thyristor has an advantage of a reduced number of interconnections and is suitable for an exposure head of a copy machine or the like. In a self-scanning semiconductor light-emitting device, the shift thyristors T are coupled by the transfer diode D, thereby a potential gradient is formed between the gates of the shift thyristors T, and a self-scanning function is realized by using a threshold voltage difference between the shift thyristors T.

In a self-scanning circuit configured in such a way, FIG. 1 illustrates four shift thyristors $T_{n-1}$ to $T_{n+2}$ as a plurality of shift thyristors T. Further, 16 light-emitting thyristors $L_{4n-7}$ to $L_{4n+8}$ are illustrated as a plurality of light-emitting thyristors L. Further, five transfer diodes $D_{n-2}$ to $D_{n+2}$ are illustrated as a plurality of transfer diodes D. Further, parasitic thyristors $P_{n-2}$ to $P_{n+2}$ are illustrated as the parasitic thyristors P. However, the number of shift thyristors T, the number of transfer diodes D, the number of parasitic thyristors P, and the number of light-emitting thyristors L may be selected as appropriate in accordance with the size or the like of a light-emitting device. The index "n" is an integer greater than or equal to two.

The transfer diodes $D_{n-2}$ to $D_{n+2}$ are connected in series so that the anode and the cathode of an adjacent transfer diode D are connected to each other. That is, the anode of the transfer diode $D_{n-2}$ is connected to the cathode of the transfer diode $D_{n-1}$, and the anode of the transfer diode $D_{n-1}$ is connected to the cathode of the transfer diode $D_n$. Further, the anode of the transfer diode $D_n$ is connected to the cathode of the transfer diode $D_{n+1}$, and the anode of the transfer diode $D_{n+1}$ is connected to the cathode of the transfer diode $D_{n+2}$. The series-connected circuit formed of the plurality of transfer diodes $D_{n-2}$ to $D_{n+2}$ forms a start signal line to which a start signal $\Phi s$ is supplied. The start signal $\Phi s$ is supplied from the end of the cathode side of the series-connected circuit. The anode of the parasitic thyristor P is connected to the anode of a corresponding transfer diode D, the cathode of the parasitic thyristor P is connected to a reference voltage, and the gate of the parasitic thyristor P is electrically opened (in a floating state).

Each of the connection nodes between adjacent transfer diodes D is connected via a gate resistor Rg to a gate line to which a power supply voltage VGK is supplied. Further, the gate of one shift thyristor T and the gates of four light-emitting thyristors L are connected to each of the connection nodes between adjacent transfer diodes D. That is, the gate of the shift thyristor $T_{n-1}$ and the gates of the light-emitting thyristors $L_{4n-7}$ to $L_{4n-4}$ are connected to the connection node between the transfer diode $D_{n-2}$ and the transfer diode $D_{n-1}$ (a common gate $G_{n-1}$). The gate of the shift thyristor $T_n$ and the gates of the light-emitting thyristors $L_{4n-3}$ to $L_{4n}$ are connected to the connection node between the transfer diode $D_{n-1}$ and the transfer diode $D_n$ (a common gate $G_n$). The gate of the shift thyristor $T_{n+1}$ and the gates of the light-emitting thyristors $L_{4n+1}$ to $L_{4n+4}$ are connected to the connection node between the transfer diode $D_n$ and the transfer diode $D_{n+1}$ (a common gate $G_{n+1}$). The gate of the shift thyristor $T_{n+2}$ and the gates of the light-emitting thyristors $L_{4n+5}$ to $L_{4n+8}$ are connected to the connection node between the transfer diode $D_{n+1}$ and the transfer diode $D_{n+2}$ (a common gate $G_{n+2}$).

The anodes of odd-numbered shift thyristors T (for example, the shift thyristors $T_{n-1}$, $T_{n+1}$) are connected to a transfer signal line to which a transfer signal $\Phi 1$ is supplied via an input resistor R1. The anodes of even-numbered shift thyristors T (for example, the shift thyristors $T_n$, $T_{n+2}$) are connected to a transfer signal line to which a transfer signal $\Phi 2$ is supplied via an input resistor R2.

The anode of the light-emitting thyristor L is connected to a predetermined lighting signal line to which a lighting signal $\Phi W$ is supplied via a resistor Rw. That is, the anodes of the light-emitting thyristors $L_{4n-7}$, $L_{4n-3}$, $L_{4n+1}$, and $L_{4n+5}$ are connected to a lighting signal line to which a lighting signal $\Phi W4$ is supplied via a resistor Rw4. The anodes of the light-emitting thyristors $L_{4n-6}$, $L_{4n-2}$, $L_{4n+2}$, and $L_{4n+6}$ are connected to a lighting signal line to which a lighting signal ΦW3 is supplied via a resistor Rw3. The anodes of the light-emitting thyristors $L_{4n-5}$, $L_{4n-1}$, $L_{4n+3}$, and $L_{4n+7}$ are connected to a lighting signal line to which a lighting signal ΦW2 is supplied via a resistor Rw2. The anodes of the light-emitting thyristors $L_{4n-4}$, $L_{4n}$, $L_{4n+4}$, and $L_{4n+8}$ are connected to a lighting signal line to which a lighting signal ΦW1 is supplied via a resistor Rw1.

Next, a transfer operation in an on-state of the shift thyristor T in the semiconductor light-emitting device 100 according to the present embodiment will be described with reference to FIG. 1 to FIG. 2C. In this example, the power supply voltage VGK supplied to the gate line is 5 V, and the transfer signals Φ1 and Φ2 supplied to the transfer signal lines are at either 0 V or 5 V.

Figure 2A:
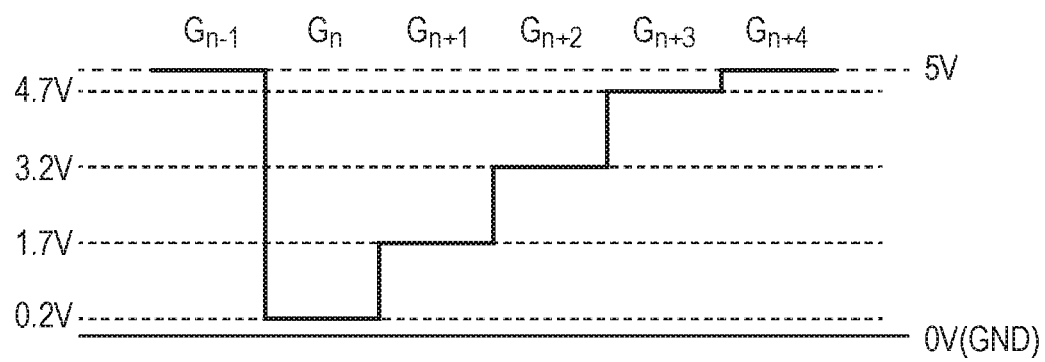
FIG. 2A, FIG. 2B and FIG. 2C are diagrams illustrating a transfer operation in an on-state of a shift thyristor in the semiconductor light-emitting device according to the first embodiment of the present invention.
Figure 2B:
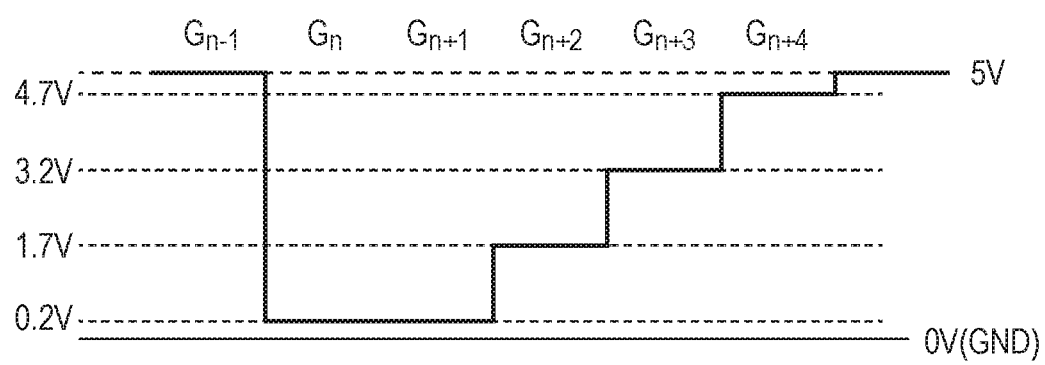
Figure 2C:
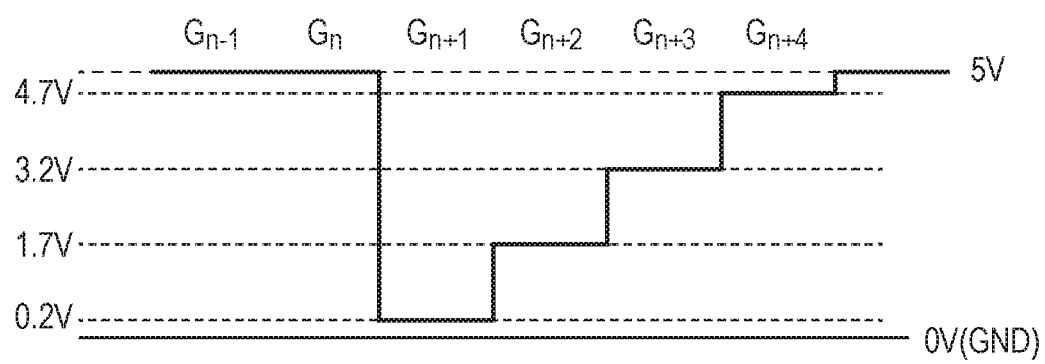

FIG. 2A and FIG. 2C are diagrams illustrating the transfer operation in the on-state of shift thyristors in the semiconductor light-emitting device according to the present embodiment.

FIG. 2A illustrates a distribution of the potentials of the common gates $G_{n-1}$ to $G_{n+4}$ when the transfer signal Φ1 is at 0 V, the transfer signal Φ2 is at 5V, and the shift thyristor $T_n$ is in the on-state. Note that the common gates $G_{n+3}$ and $G_{n+4}$ are common gates that are on the post-stage of the common gate $G_{n+2}$ and are not illustrated in FIG. 1.

When the shift thyristor $T_n$ is in the on-state, the potential of the common gate $G_n$ connected to the gate of the shift thyristor $T_n$ and the gates of the light-emitting thyristors $L_{4n-3}$ to $L_{4n}$ decreases to around 0.2 V. A potential difference that is substantially the same as a diffusion potential of the transfer diode $D_n$ that connects the common gate $G_n$ to the common gate $G_{n+1}$ occurs between the common gate $G_n$ and the common gate $G_{n+1}$. In the present embodiment, the diffusion potential of the transfer diode $D_n$ is around 1.5 V, and the potential of the common gate $G_{n+1}$ is 1.7 V that is an addition of 0.2 V, which is the potential of the common gate $G_n$, and 1.5V, which is the diffusion potential of the transfer diode $D_n$. Similarly, the potential of the common gate $G_{n+2}$ is 3.2 V, and the potential of the common gate $G_{n+3}$ (not illustrated) is 4.7 V.

Here, since the upper limit voltage of the common gate G is the power supply voltage VGK, the potential of the common gate $G_{n+4}$ and the post stage thereof is 5 V that is the value of the power supply voltage VGK. Further, since the transfer diode D between the common gate $G_n$ and the common gate $G_{n-1}$ is reverse-biased, the power supply voltage VGK is directly supplied to the common gate $G_{n-1}$. The same applies for the common gate G on the pre-stage of the common gate $G_{n-1}$. That is, the potential of the common gate $G_{n-1}$ or the like on the pre-stage of the common gate $G_n$ is 5 V that is the value of the power supply voltage VGK. In such a way, the potential gradient as illustrated in FIG. 2A is formed in the common gates $G_n$ to $G_{n+3}$.

A voltage (threshold voltage) required to turn on the shift thyristor T is substantially the same as a voltage that is an addition of the gate potential and the diffusion potential. When the shift thyristor $T_n$ is turned on, the shift thyristor having the lowest gate potential in other shift thyristors T connected to the transfer signal line to which the transfer signal Φ2 is supplied is the shift thyristor $T_{n+2}$. The potential of the common gate $G_{n+2}$ corresponding to the shift thyristor $T_{n+2}$ is 3.2 V as described above, and the threshold voltage of the shift thyristor $T_{n+2}$ is 4.7 V.

However, because the shift thyristor $T_n$ is in the on-state, the potential of the transfer signal line to which the transfer signal Φ2 is supplied has decreased to the voltage corresponding to the diffusion potential (around 1.5 V). Thus, the potential of the transfer signal line to which the transfer signal Φ2 is supplied is lower than the threshold voltage of the shift thyristor $T_{n+2}$, and the shift thyristor $T_{n+2}$ is unable to be turned on. All the other shift thyristors T connected to the same transfer signal line have higher threshold voltages than the shift thyristor $T_{n+2}$ and thus are unable to be turned on as with the shift thyristor $T_{n+2}$. As a result, only the shift thyristor $T_n$ can be maintained in the on-state.

FIG. 2B illustrates a distribution of the potentials of the common gates $G_{n-1}$ to $G_{n+4}$ when the transfer signal Φ1 is changed to 5 V from the state of FIG. 2A.

When the shift thyristor T connected to the transfer signal line to which the transfer signal Φ1 is supplied is focused on, the threshold voltage of the shift thyristor $T_{n+1}$ in a state of the lowest threshold voltage is 3.2 V. The threshold voltage of the shift thyristor $T_{n+3}$ in a state of the next lowest threshold voltage is 6.2 V. Therefore, when the transfer signal Φ1 is changed from 0 V to 5 V in this state, only the shift thyristor $T_{n+1}$ can be turned on out of the shift thyristors T connected to the transfer signal line to which the transfer signal Φ1 is supplied. In this state, the shift thyristor $T_n$ and the shift thyristor $T_{n+1}$ are in the on-state, and the gate potentials of the shift thyristors T on the right side of the shift thyristor $T_{n+1}$ decrease each by the diffusion potential. However, the power supply voltage VGK is 5 V, and the gate potential is limited by the power supply voltage VGK. Therefore, the gate potential is 5 V in the shift thyristors T on the right side of the shift thyristor $T_{n+5}$.

FIG. 2C illustrates a distribution of the potentials of the common gates $G_{n-1}$ to $G_{n+4}$ when the transfer signal Φ2 is changed to 0 V from the state of FIG. 2B.

When the transfer signal Φ2 is changed from 5 V to 0 V, the shift thyristor $T_n$ is turned off. Thereby, the potential of the common gate $G_n$ increases to the power supply voltage VGK.

In such a way, transfer of the on-state from the shift thyristor $T_n$ to the shift thyristor $T_{n+1}$ is completed.

Note that, while the parasitic thyristor P is connected to the anode of the transfer diode D, the gate of the parasitic thyristor P is opened. Thus, to turn on the parasitic thyristor P, a high voltage around 20 V or higher is required, for example. Typically, since each voltage of the power supply voltage VGK and the transfer signals Φ1 and Φ2 is around 5 V or lower, the parasitic thyristor P is not turned on, and the parasitic thyristor P does not affect the transfer operation in the on-state of the shift thyristor T.

Next, a light-emitting operation of the light-emitting thyristor L in the semiconductor light-emitting device according to the present embodiment will be described with reference to FIG. 1 to FIG. 3. In this example, the power supply voltage VGK supplied to the gate line is 5 V, and voltages of the transfer signals Φ1 and Φ2 supplied to the transfer signal lines and the lighting signals ΦW1, ΦW2, ΦW3, and ΦW4 supplied to the lighting signal lines are either 0 V or 5 V.

When the shift thyristor $T_n$ is in the on-state, the potential of the common gate $G_n$ is around 0.2 V as described above. Therefore, the threshold voltage of the light-emitting thyristors $L_{4n-3}$ to $L_{4n}$ connected to the common gate $G_n$ is 1.7 V. That is, if the lighting signals ΦW1 to ΦW4 having a voltage of 1.7 V or higher are supplied, the light-emitting thyristors $L_{4n-3}$ to $L_{4n}$ can emit light. Here, the lighting signals ΦW1, ΦW2, ΦW3, and ΦW4 correspond to the light-emitting thyristors $L_{4n-3}$, $L_{4n-2}$, $L_{4n-1}$, and $L_{4n}$, respectively. Therefore, the light-emitting thyristors $L_{4n-3}$, $L_{4n-2}$, $L_{4n-1}$, and $L_{4n}$ can be caused to emit light by any combination in accordance with a combination of the lighting signals ΦW1, ΦW2, ΦW3, and ΦW4.

When the potential of the common gate $G_n$ is 0.2 V, the potential of the adjacent common gate $G_{n+1}$ is 1.7 V, and the threshold voltage of the light-emitting thyristors $L_{4n+1}$ to $L_{4n+4}$ connected to the common gate $G_{n+1}$ is 3.2 V. Since the lighting signals ΦW1 to ΦW4 are at 5 V, it appears that the light-emitting thyristors $L_{4n+1}$ to $L_{4n+4}$ emit light at the same time as lighting drive of the light-emitting thyristors $L_{4n-3}$ to $L_{4n}$.

However, since the threshold voltages of the light-emitting thyristors $L_{4n-3}$ to $L_{4n}$ are lower than the threshold voltages of the light-emitting thyristors $L_{4n+1}$ to $L_{4n+4}$, the light-emitting thyristors $L_{4n-3}$ to $L_{4n}$ are turned on earlier than the light-emitting thyristors $L_{4n+1}$ to $L_{4n+4}$. Once the light-emitting thyristors $L_{4n+1}$ to $L_{4n+4}$ are turned on, the potential of the lighting signal line connected to the turned-on light-emitting thyristors $L_{4n+1}$ to $L_{4n+4}$ decreases to 1.5 V corresponding to the diffusion potential. As a result, the potential of the lighting signal line of interest becomes lower than the threshold voltage of the light-emitting thyristors $L_{4n+1}$ to $L_{4n+4}$, and the light-emitting thyristors $L_{4n+1}$ to $L_{4n+4}$ are not turned on.

Figure 3:
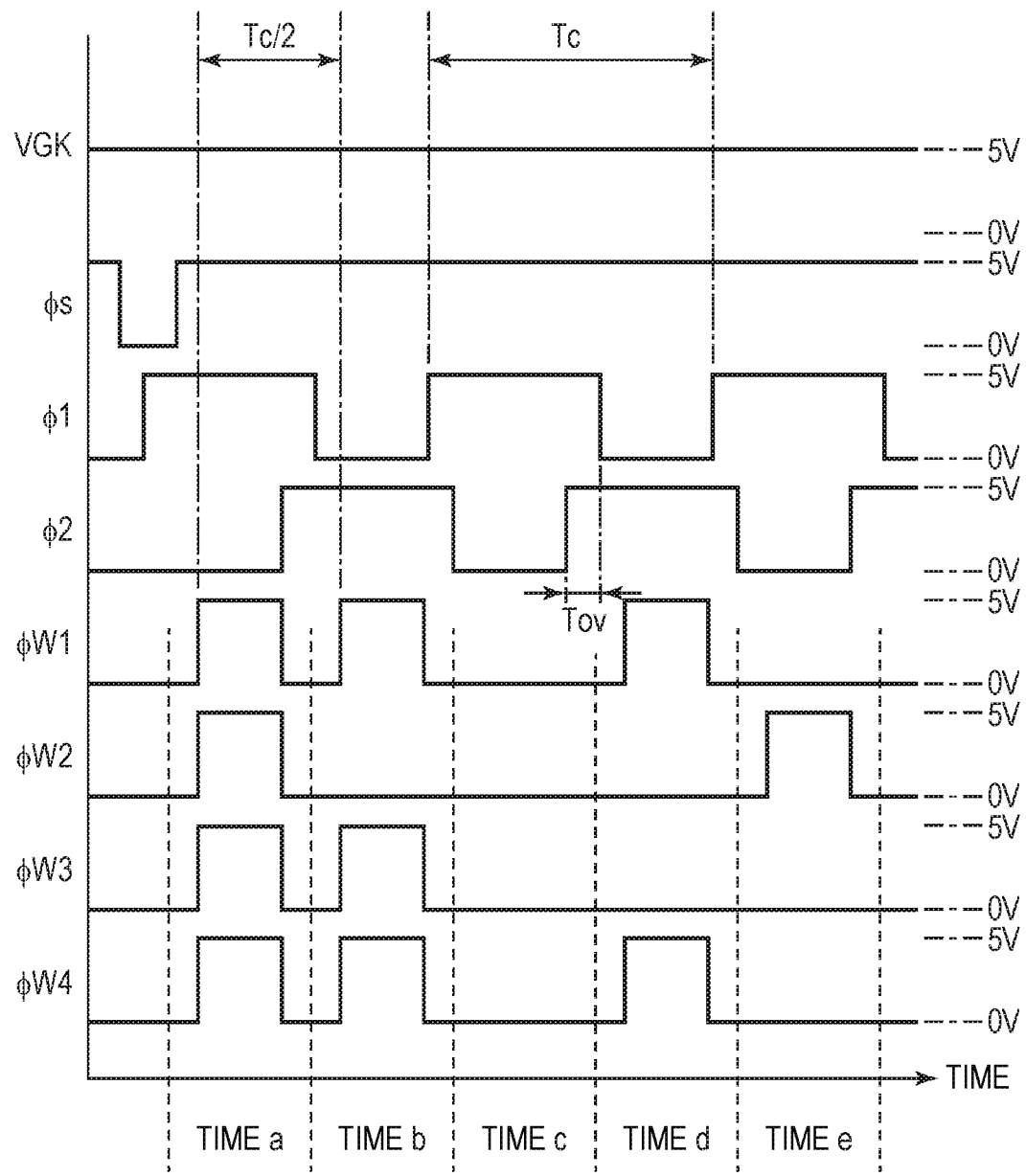
FIG. 3 is a timing diagram illustrating a method of driving the semiconductor light-emitting device according to the first embodiment of the present invention.

FIG. 3 is a timing diagram illustrating one example of a method of driving the semiconductor light-emitting device according to the present embodiment. FIG. 3 illustrates the power supply voltage VGK, the start signal Φs, the transfer signals Φ1 and Φ2, and the lighting signals ΦW1, ΦW2, ΦW3, and ΦW4. The transfer signal Φ1 is a clock signal used for the odd-numbered shift thyristors T, and the transfer signal Φ2 is a clock signal used for the even-numbered shift thyristors T.

First, the start signal Φs is changed from 5 V to 0 V. Thereby, the potential of the common gate G connected to the gate of the shift thyristor T that is closest to the input side of the start signal Φs (for example, the common gate $G_{n-1}$) decreases from 5 V to 1.7 V, and the threshold voltage of the shift thyristor $T_{n-1}$ is 3.2 V. Thereby, the shift thyristor $T_{n-1}$ is ready to be turned on by the transfer signal Φ1.

Next, the transfer signal Φ1 is changed from 0 V to 5 V to turn on the shift thyristor $T_{n-1}$. Further, slightly after the shift thyristor $T_{n-1}$ is turned on, the start signal Φs is changed from 0 V to 5 V. The start signal Φs remains at 5 V until the start timing of the next lighting operation.

The transfer signal Φ1 is the clock signal used for the odd-numbered shift thyristors T and has periodic pulses rising from 0 V to 5 V in a cycle Tc. The transfer signal Φ2 is a clock signal used for the even-numbered shift thyristors T and has periodic pulses rising from 0 V to 5 V at the same cycle Tc as the transfer signal Φ1. The transfer signal Φ1 and the transfer signal Φ2 are signals of approximately opposite phases but are configured to have a period Tov in which the on-states (periods of 5V) of both the transfer signals are overlapped after a rising edge and before a falling edge of each pulse.

The lighting signals ΦW1, ΦW2, ΦW3, and ΦW4 are transmitted in a half the cycle of the transfer signals Φ1 and Φ2 (Tc/2). If the lighting signal ΦW of 5 V is applied when the shift thyristor T is in the on-state, the light-emitting thyristor L corresponding to the lighting signal ΦW that has transitioned to 5V emits light.

For example, at time a, out of four light-emitting thyristors L connected to the same shift thyristor T (for example, the shift thyristor $T_{n-1}$), four light-emitting thyristors L corresponding to the lighting signals ΦW1, ΦW2, ΦW3, and ΦW4 emit light at the same time. Further, at time b, out of four light-emitting thyristors L connected to the same shift thyristor T (for example, the shift thyristor $T_n$), three light-emitting thyristors L corresponding to the lighting signals ΦW1, ΦW3, and ΦW4 emit light at the same time. Further, at time c, all the lighting signals ΦW1, ΦW2, ΦW3, and ΦW4 are at 0 V, and all the light-emitting thyristors L are thus in the turn-off state. Further, at time d, out of four light-emitting thyristors L connected to the same shift thyristor T (for example, the shift thyristor $T_{n+2}$ (not illustrated)), two light-emitting thyristors L corresponding to the lighting signals ΦW1 and ΦW4 emit light at the same time. Further, at time e, out of four light-emitting thyristors L connected to the same shift thyristor T (for example, the shift thyristor $T_{n+3}$), only the light-emitting thyristor L corresponding to the lighting signal ΦW2 emits light.

Next, the specific structure of the semiconductor light-emitting device 100 according to the present embodiment will be described with reference to FIG. 4A to FIG. 6B.

Figure 4A:
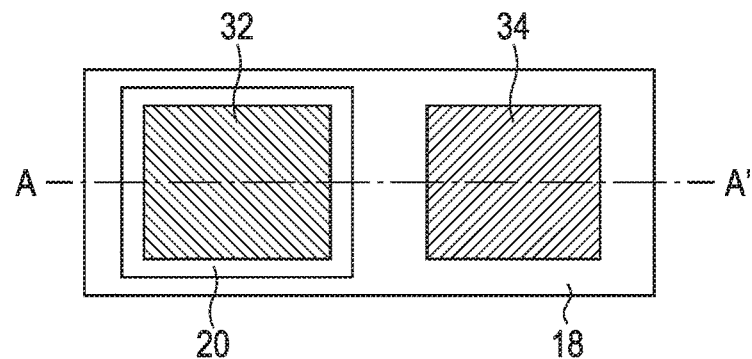
FIG. 4A, FIG. 4B and FIG. 4C are schematic diagrams illustrating a semiconductor element forming a transfer diode portion of the semiconductor light-emitting device according to the first embodiment of the present invention.
Figure 4B:
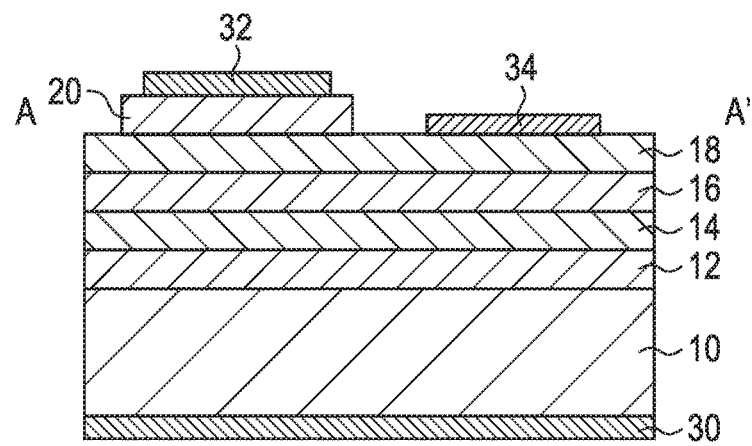
Figure 4C:
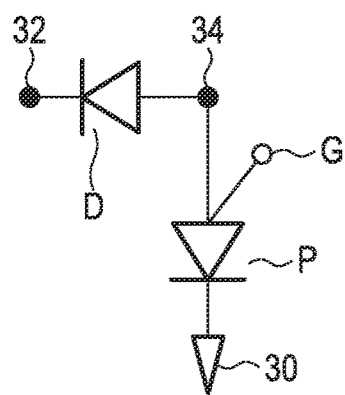

FIG. 4A to FIG. 4C are schematic diagrams illustrating a semiconductor element forming a transfer diode portion of the semiconductor light-emitting device according to the present embodiment. FIG. 4A is a plan view, FIG. 4B is a cross-sectional view taken along a line A-A' of FIG. 4A, and FIG. 4C is an equivalent circuit diagram of the transfer diode portion. Note that, in the present embodiment, the transfer diode portion means a portion in which the transfer diode D is arranged when the semiconductor light-emitting device of the present embodiment is formed on the semiconductor substrate. The transfer diode portion includes the transfer diode D and the parasitic thyristor P of the circuit components illustrated in FIG. 1.

The transfer diode portion is provided over a semiconductor substrate 10. A semiconductor layer 12 of a first conductivity type (for example, the n-type), a semiconductor layer 14 of a second conductivity type (for example, the p-type) that is different from the first conductivity type, a semiconductor layer 16 of the first conductivity type, a semiconductor layer 18 of the second conductivity type, and a semiconductor layer 20 of the first conductivity type are stacked in this order on the semiconductor substrate 10. Each of the semiconductor layers 12, 14, 16, 18, and 20 may be formed of a plurality of semiconductor layers. The transfer diode portion is formed of the stacked layers of these semiconductor layers.

The semiconductor layer 20 on the semiconductor layer 18 is partially removed. An electrode 34 is provided on the exposed semiconductor layer 18. An electrode 30 is provided on a face of the semiconductor substrate 10 that is opposite to the face on which the semiconductor layer 12 is provided. In such a case, it is desirable that the semiconductor substrate 10 have the first conductivity type. Further, the semiconductor layer 12 may be omitted, and the semiconductor substrate 10 of the first conductivity type may be used instead of the semiconductor layer 12. An electrode 32 is provided on the semiconductor layer 20.

In such a way, the transfer diode D is formed by the p-n junction of the semiconductor layers 18 and 20. Further, the parasitic thyristor P is formed by the p-n-p-n junction of the semiconductor layers 18, 16, 14, and 12. The electrodes 34 and 32 form the anode electrode and the cathode electrode of the transfer diode D. Further, the electrodes 34 and 30 form the anode electrode and the cathode electrode of the parasitic thyristor P. For example, when the second conductivity type is the p-type, the electrode 34 is the anode electrode of the transfer diode D and the parasitic thyristor P. The electrode 30 is also an electrode to which a reference voltage (for example, 0 V) is supplied. The gate of the parasitic thyristor P (the semiconductor layer 16 or the semiconductor layer 14) is in a state without an electrical connection part such as an electrode (an opened state or a floating state).

The equivalent circuit diagram of the transfer diode portion formed in such a way is as illustrated in FIG. 4C.

Figure 5:
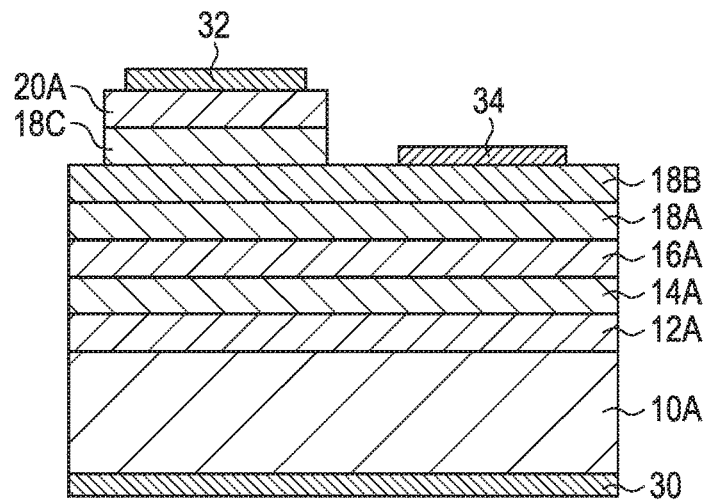
FIG. 5 is a schematic cross-sectional view illustrating a configuration example of the transfer diode portion in the semiconductor light-emitting device according to the first embodiment of the present invention.

FIG. 5 is a schematic cross-sectional view illustrating a specific configuration example of the transfer diode portion in the semiconductor light-emitting device according to the present embodiment. FIG. 5 corresponds to a cross-sectional view taken along a line A-A' of FIG. 4A. Components corresponding to the components illustrated in FIG. 4A to FIG. 4C are labeled with the same references and are distinguished by appending indices of A, B, or C to the references.

An n-type AlGaAs layer 12A, a p-type AlGaAs layer 14A, an n-type AlGaAs layer 16A, and a p-type AlGaAs layer 18A are provided over an n-type GaAs substrate 10A. A p-type AlGaAs layer 18B, a p-type AlGaAs layer 18C, and an n-type AlGaAs layer 20A are provided over the AlGaAs layer 18A. The transfer diode portion is formed of the stacked layers of these semiconductor layers.

The AlGaAs layers 18C and 20A on the AlGaAs layer 18B are partially removed. The electrode 34 forming the anode electrode of the transfer diode D is provided on the exposed AlGaAs layer 18B. The electrode 30 is provided on a face of the GaAs substrate 10A that is opposite to the face on which the AlGaAs layer 12A is provided. The electrode 32 forming the cathode electrode of the transfer diode D is provided on the AlGaAs layer 20A.

In such a way, the transfer diode D is formed by the p-n junction between the p-type AlGaAs layer 18C and the n-type AlGaAs layer 20A. Further, the parasitic thyristor P is formed by the p-n-p-n junction between the p-type AlGaAs layer 18A, the n-type AlGaAs layer 16A, the p-type AlGaAs layer 14A, and the n-type AlGaAs layer 12A. The p-type AlGaAs layer 18B is a contact layer between the p-type AlGaAs layer 18A and the electrode 34.

Herein, the parasitic thyristor P is formed as a result of integration of the transfer diode D, the light-emitting thyristor L, and the shift thyristor T on a single semiconductor substrate 10.

Figure 6A:
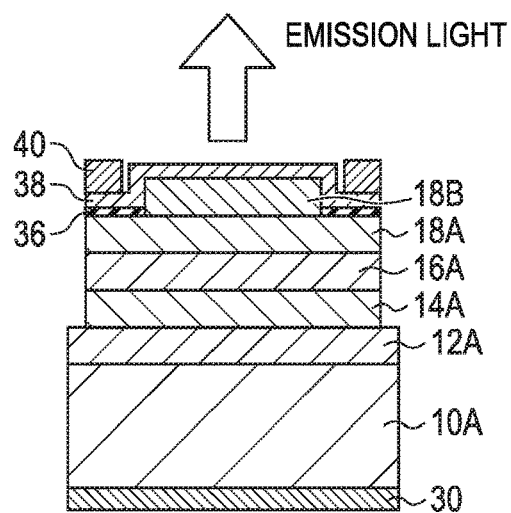
FIG. 6A is a schematic cross-sectional view illustrating a configuration example of a light-emitting thyristor portion in the semiconductor light-emitting device according to the first embodiment of the present invention.
Figure 6B:
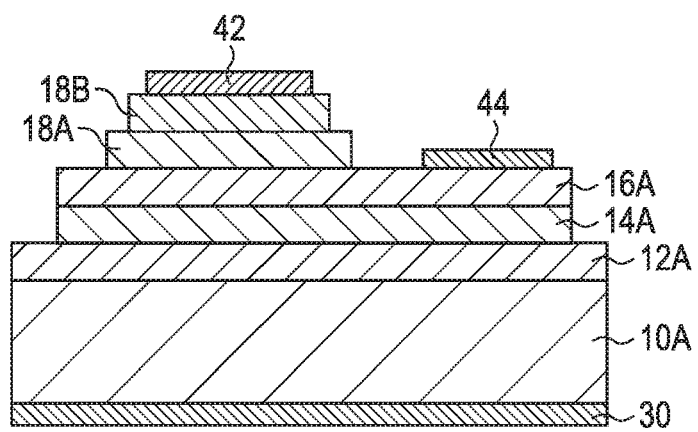
FIG. 6B is a schematic cross-sectional view illustrating a configuration example of a shift thyristor portion in the semiconductor light-emitting device according to the first embodiment of the present invention.

FIG. 6A is a schematic diagram illustrating an example of a semiconductor element forming the light-emitting thyristor portion in the semiconductor light-emitting device according to the present embodiment. FIG. 6B is a schematic diagram illustrating an example of a semiconductor element forming the shift thyristor portion in the semiconductor light-emitting device according to the present embodiment. Note that, in the present embodiment, the light-emitting thyristor portion means a portion in which the light-emitting thyristor L is arranged when the semiconductor light-emitting device of the present embodiment is formed on the semiconductor substrate. Further, in the present embodiment, the shift thyristor portion means a portion in which the shift thyristor T is arranged when the semiconductor light-emitting device of the present embodiment is formed on the semiconductor substrate.

The light-emitting thyristor portion is formed of the stacked layers including the AlGaAs layers 12A, 14A, 16A, 18A, and 18B out of the AlGaAs layers 12A, 14A, 16A, 18A, 18B, 18C, and 20A provided on the GaAs substrate 10A. The AlGaAs layers 18C and 20A of the light-emitting thyristor portion are removed after deposition or, alternatively, are not deposited during deposition.

The AlGaAs layer 18B on the AlGaAs layer 18A has been partially removed. An insulating layer 36 is provided over the exposed AlGaAs layer 18A. A transparent electrode 38 is provided over the AlGaAs layer 18B. The transparent electrode 38 extends over the insulating layer 36, and an electrode 40 forming the anode electrode of the light-emitting thyristor L is provided in a region above the transparent electrode 38 in which the insulating layer 36 is provided. The electrode 30 is provided on a face on the opposite side of the face of the GaAs substrate 10A on which the AlGaAs layer 12A is provided.

In such a way, the light-emitting thyristor L is formed by the p-n-p-n junction between the p-type AlGaAs layer 18A, the n-type AlGaAs layer 16A, the p-type AlGaAs layer 14A, and the n-type AlGaAs layer 12A provided in the light-emitting thyristor portion.

A light-emitting current of the light-emitting thyristor L is supplied from the electrode 40 and flows to the electrode 30 via the transparent electrode 38, the AlGaAs layer 18B, the AlGaAs layer 18A, the AlGaAs layer 16A, the AlGaAs layer 14A, the AlGaAs layer 12A, and the GaAs substrate 10A. A light generated in the AlGaAs layer 16A, which is a light-emitting portion, by the above light-emitting current transmits through the AlGaAs layer 18A, the AlGaAs layer 18B, and the transparent electrode 38 and is externally emitted.

The shift thyristor portion is formed of the stacked layers including the AlGaAs layers 12A, 14A, 16A, 18A, and 18B out of the AlGaAs layers 12A, 14A, 16A, 18A, 18B, 18C, and 20A provided over the GaAs substrate 10A. The AlGaAs layers 18C and 20A of the shift thyristor portion are removed after deposition or, alternatively, are not deposited during deposition.

The AlGaAs layers 18A and 18B on the AlGaAs layer 16A have been partially removed. An electrode 44 forming the gate electrode of the shift thyristor T is provided on the exposed AlGaAs layer 16A. An electrode 42 forming the anode electrode of the shift thyristor T is provided on the AlGaAs layer 18B. The electrode 30 is provided on a face that is opposite to the face of the GaAs substrate 10A on which the AlGaAs layer 12A is provided.

In such a way, the shift thyristor T is formed by the p-n-p-n junction between the p-type AlGaAs layer 18A, the n-type AlGaAs layer 16A, the p-type AlGaAs layer 14A, and the n-type AlGaAs layer 12A provided in the shift thyristor portion.

The structure of the shift thyristor T is the same as the structure of the light-emitting thyristor L, and light is emitted at the operation as a thyristor. This light emission causes image deterioration when the semiconductor light-emitting device is used as an exposure head of a copy machine, for example. It is therefore desirable that the shift thyristor portion be covered with a light shield member (for example, a metal film or the like) if necessary.

Note that, although the description is omitted in FIG. 6A, the light-emitting thyristor L also includes an electrode forming the gate as with the shift thyristor T.

The composition, the thickness, and the impurity concentration of each of the AlGaAs layers 12A, 14A, 16A, and 18A are appropriately set so that desired thyristor characteristics are obtained in the light-emitting thyristor L and the shift thyristor T. The AlGaAs layers 18C and 20A are appropriately set so that a desired diode characteristic of the transfer diode D is obtained.

For example, the AlGaAs layer 12A may be formed of an n-type AlGaAs layer having a thickness of 600 nm, an Al composition of 25%, and an acceptor impurity concentration of $2 \times 10^{18}$ cm$^{-3}$. The AlGaAs layer 14A may be formed of a p-type AlGaAs layer having a thickness of 700 nm, an Al composition of 25%, and a donor impurity concentration of $2 \times 10^{18}$ cm$^{-3}$. The AlGaAs layer 16A may be formed of an n-type AlGaAs layer having a thickness of 350 nm, an Al composition of 15%, and a donor impurity concentration of $2\times10^{17}$ cm$^{-3}$. The AlGaAs layer 18A may be formed of a p-type AlGaAs layer having a thickness of 320 nm, an Al composition of 30%, and an acceptor impurity concentration of $2\times10^{17}$ cm$^{-3}$.

Since the impurity concentration of the AlGaAs layer 18A is low and it is difficult to form an ohmic contact with a metal electrode, the AlGaAs layer 18B is provided as a contact layer. The AlGaAs layer 18B may be formed of a p-type AlGaAs layer having a thickness of 200 nm, an Al composition of 30%, and an acceptor impurity concentration of $7\times10^{19}$ cm$^{-3}$.

Further, the AlGaAs layer 18C may be formed of a p-type AlGaAs layer having a thickness of 200 nm, an Al composition of 30%, and an acceptor impurity concentration of $3\times10^{18}$ cm$^{-3}$. The AlGaAs layer 20A is formed of an n-type AlGaAs layer having a thickness of 400 nm, an Al composition of 30%, and a donor impurity concentration of $3\times10^{18}$ cm$^{-3}$.

Note that an important feature as a function of the transfer diode D is the p-n junction at the interface between the AlGaAs layer 18C and the AlGaAs layer 20A. When a metal material forming electrode 32 is diffused due to a thermal process or the like and reaches the p-n junction interface, the diode function is prevented, which is unpreferable. According to study by the present inventors and the like, it was confirmed that a metal material is diffused up to a depth of around 400 nm. Thus, it is preferable that the thickness of the AlGaAs layer 20A be larger than or equal to 400 nm in terms of preventing diffusion of a metal material to the p-n junction interface.

In the semiconductor light-emitting device of the present embodiment, the parasitic thyristor P is connected to the transfer diode D. The reason why the semiconductor layer forming the parasitic thyristor P is left in the portion of the transfer diode D is to simplify the manufacturing process and thus reduce the manufacturing cost.

In the case of such a configuration, the transfer diode D can be formed by using two layers of the semiconductor layers forming the shift thyristor T and the light-emitting thyristor L. For example, the AlGaAs layer 16A may be used as the cathode, the AlGaAs layer 18A may be used as the anode, and the transfer diode D may be formed of the p-n junction thereof. The equivalent circuit of the transfer portion in such a case is as illustrated in FIG. 7, for example.

Figure 7:
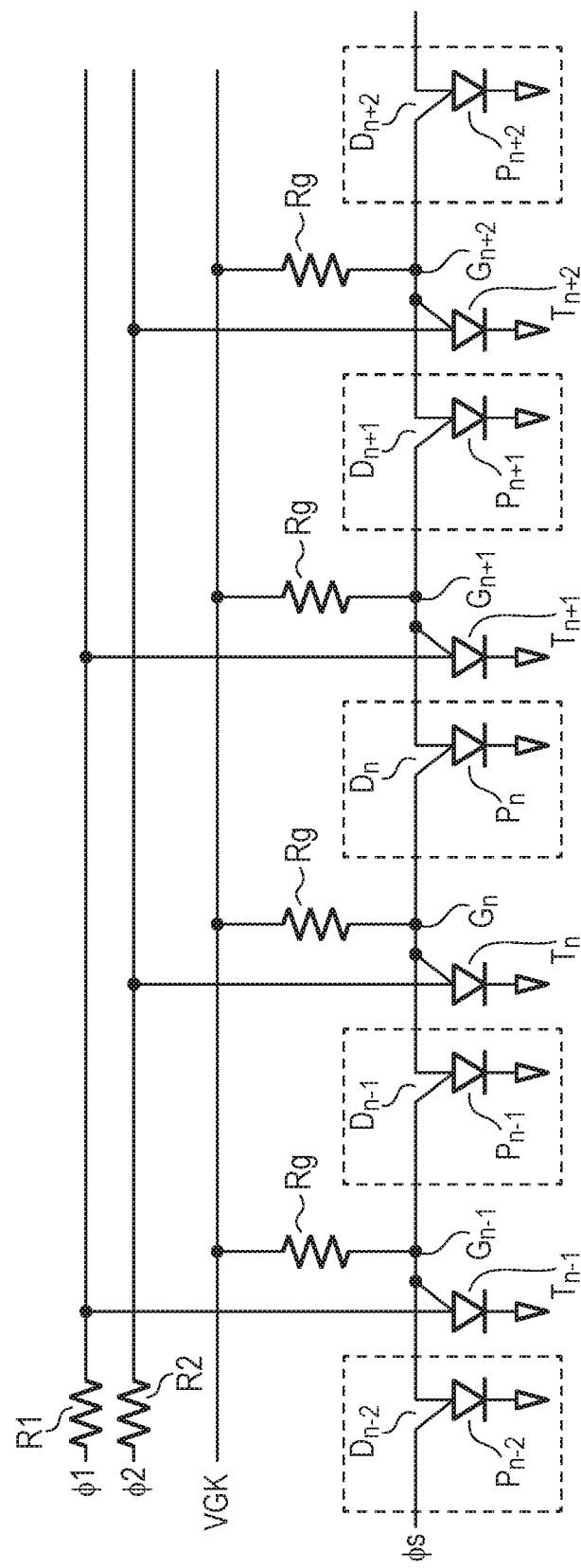
FIG. 7 is an equivalent circuit diagram of a scanning circuit unit in a semiconductor light-emitting device according to a comparative example.

In the circuit illustrated in FIG. 7, however, since a part of the thyristor structure is used as the transfer diode D, the parasitic thyristor P may be turned on for a particular condition of a voltage applied to the transfer diode D, and a desired gate potential gradient will not be obtained in some cases.

Figure 8:
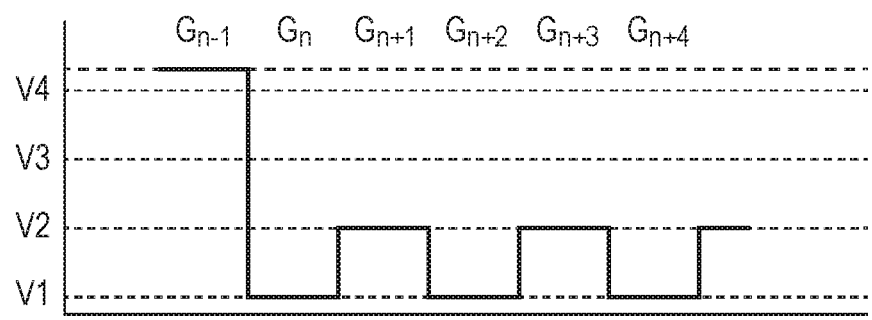
FIG. 8 is a diagram illustrating a problem in the semiconductor light-emitting device according to the comparative example.

FIG. 8 illustrates one example of a case where a desired gate potential gradient is not obtained because the parasitic thyristors $P_{n+2}$ and $P_{n+4}$ connected to the transfer diodes $D_{n+2}$ and $D_{n+4}$ are turned on. FIG. 8 illustrates a state where the shift thyristor $T_n$ is in the on-state as with FIG. 2A. However, because the parasitic thyristors $P_{n+2}$ and $P_{n+4}$ are turned on, both the potentials of the common gates $G_{n+2}$ and $G_{n+4}$ decrease to the potential V1 rather than the potential V3 and the power supply voltage VGK that are originally intended to be.

In the range illustrated in FIG. 8, since the common gates $G_n$, $G_{n+2}$, and $G_{n+4}$ are at the potential V1, respectively, this results in a state where it is not defined which of the shift thyristor T is turned on when the transfer signal Φ2 is applied. Therefore, normal transfer may be unable to be performed, a malfunction such as transfer return or transfer jump is likely to occur.

In this regard, in the present embodiment, the transfer diode D is formed by using semiconductor layers (AlGaAs layers 18C and 20A) that are different from the semiconductor layers (AlGaAs layers 12A, 14A, 16A, and 18A) forming the shift thyristor T and the light-emitting thyristor L. Further, the gate of the parasitic thyristor P is opened to suppress the parasitic thyristor P from being turned on.

Since no current flows between the anode and the gate, the parasitic thyristor P with the gate opened is basically not turned on. As a characteristic of a thyristor, however, the thyristor may be turned on if a voltage above a certain value is applied to the anode even when the gate is opened. The anode voltage by which a thyristor is turned on when the gate is opened is referred to as an on-voltage VBO of the thyristor. If the on-voltage VBO is low, the parasitic thyristor P will be turned on by some anode voltage.

However, inspection of the on-voltage VBO of the parasitic thyristor P connected to the transfer diode D in the above configuration of the present embodiment shows that the on-voltage VBO of the parasitic thyristor P is 20 V or higher. Typically, since the power supply voltage VGK and the drive voltage of the transfer signals Φ1 and Φ2 or the like are around 5 V or lower, the parasitic thyristor P is not turned on.

Therefore, according to the present embodiment, it is possible to suppress the parasitic thyristor P connected to the transfer diode D from being turned on and stably perform a transfer operation in an on-state of the shift thyristor T.

Second Embodiment

Figure 9:
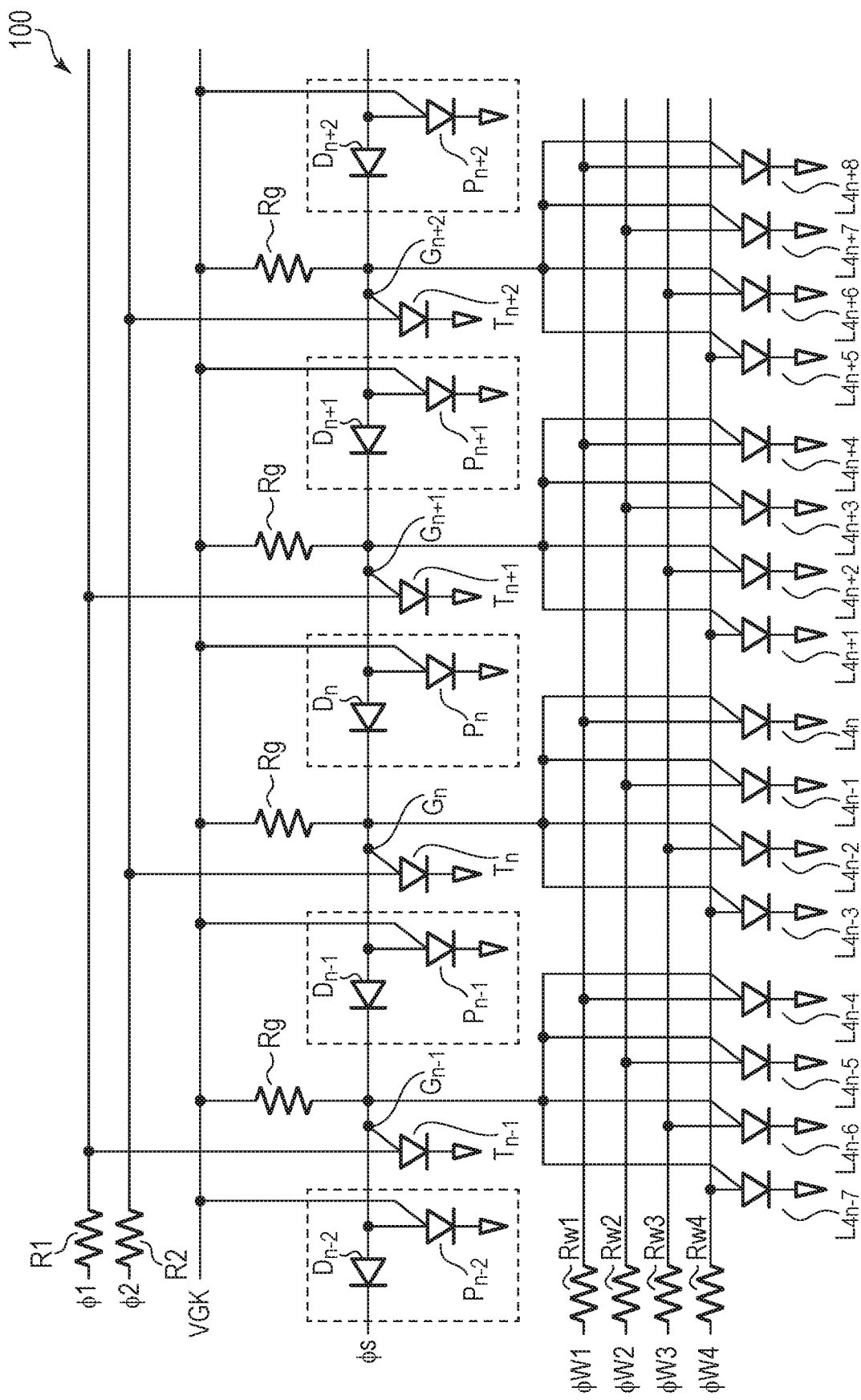
FIG. 9 is an equivalent circuit diagram illustrating a general configuration of a semiconductor light-emitting device according to a second embodiment of the present invention.

A semiconductor light-emitting device according to a second embodiment of the present invention will be described with reference to FIG. 9 to FIG. 10C. The same components as those of the semiconductor light-emitting device according to the first embodiment are labeled with the same references, and the description thereof will be omitted or simplified. FIG. 9 is an equivalent circuit diagram illustrating a general configuration of the semiconductor light-emitting device according to the present embodiment. FIG. 10A to FIG. 10C are schematic diagrams illustrating the structure of a transfer diode of the semiconductor light-emitting device according to the present embodiment.

The semiconductor light-emitting device 100 according to the present embodiment is the same as the semiconductor light-emitting device according to the first embodiment except that a fixed voltage is supplied to the gates of the parasitic thyristors P connected to the transfer diodes D. That is, although the gates of the parasitic thyristors P are opened in the semiconductor light-emitting device according to the first embodiment, the gates of the parasitic thyristors P are connected to the power supply voltage VGK as illustrated in FIG. 9 in the semiconductor light-emitting device 100 according to the present embodiment.

In the first embodiment, the gate of each parasitic thyristor P is opened to increase the on-voltage VBO and suppress the parasitic thyristor P from operating. However, since the gate of each parasitic thyristor P is opened, that is, in a floating state, the potential thereof may change due to electrostatic induction or the like, and the parasitic thyristor P is likely to be turned on at a low voltage.

By connecting the gate of each parasitic thyristor P to the power supply voltage VGK and fixing the potential thereof as with the present embodiment, it is possible to prevent the parasitic thyristor P from being turned on at low voltage due to disturbance or the like and provide a more stable transfer operation in the on-state. Note that the operation of the semiconductor light-emitting device according to the present embodiment is the same as the operation of the semiconductor light-emitting device according to the first embodiment.

Figure 10A:
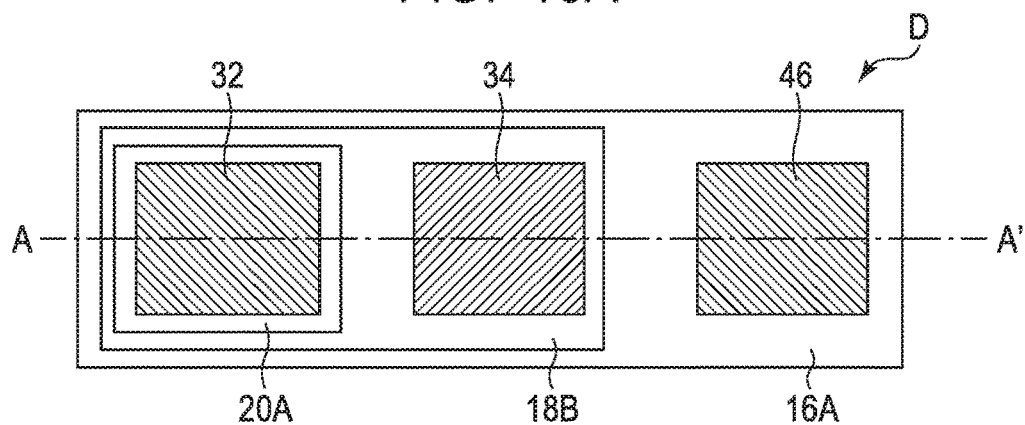
FIG. 10A, FIG. 10B and FIG. 10C are schematic diagrams illustrating a semiconductor element forming a transfer diode portion of the semiconductor light-emitting device according to the second embodiment of the present invention.
Figure 10B:
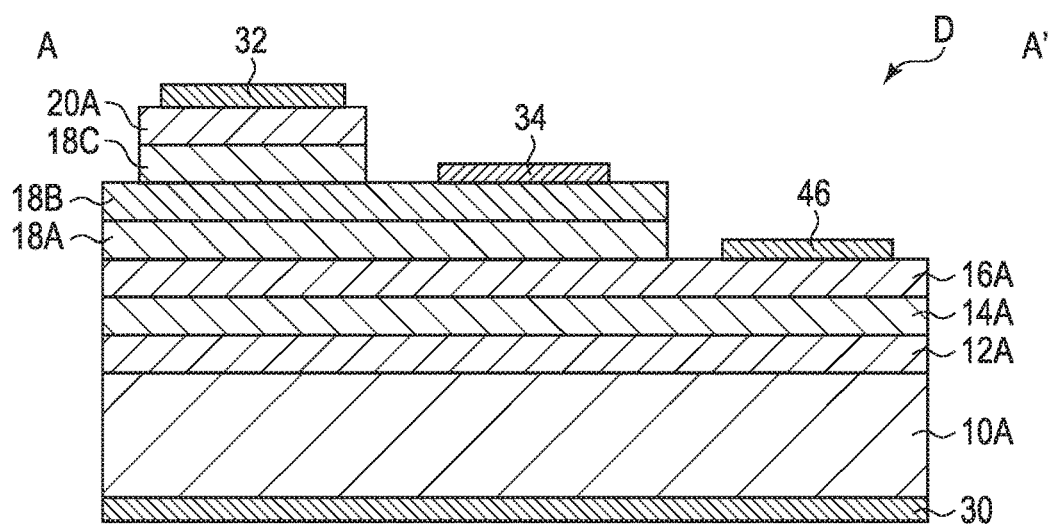
Figure 10C:
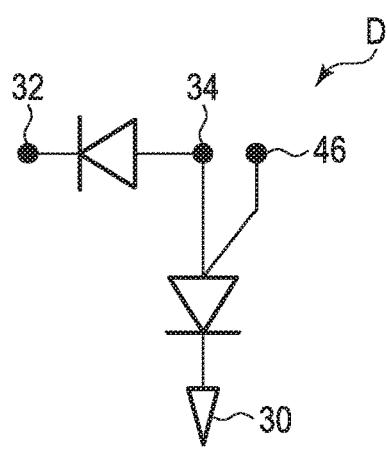

FIG. 10A to FIG. 10C are schematic diagrams illustrating one example of a semiconductor element forming a transfer diode portion of the semiconductor light-emitting device according to the present embodiment. FIG. 10A is a plan view, FIG. 10B is a cross-sectional view taken along a line A-A' of FIG. 10A, and FIG. 10C is an equivalent circuit diagram of the transfer diode D.

The n-type AlGaAs layer 12A, the p-type AlGaAs layer 14A, and the n-type AlGaAs layer 16A are provided over the n-type GaAs substrate 10A. The p-type AlGaAs layer 18A and the p-type AlGaAs layer 18B are provided over the AlGaAs layer 16A. The p-type AlGaAs layer 18C and the n-type AlGaAs layer 20A are provided over the AlGaAs layer 18B. The stacked structure of the semiconductor layers in the transfer diode D of the present embodiment is the same as the transfer diode D of the first embodiment.

The electrode 30 is provided on a face of the GaAs substrate 10A that is opposite to the face on which the AlGaAs layer 12A is provided. The electrode 32 forming the cathode electrode of the transfer diode D is provided on the AlGaAs layer 20A. The AlGaAs layers 18A, 18B, 18C, and 20A on the AlGaAs layer 16A have been partially removed, and an electrode 46 forming the gate of the parasitic thyristor P is provided on the exposed AlGaAs layer 16A. Further, the AlGaAs layers 18C and 20A on the AlGaAs layer 18B have been partially removed, and the electrode 34 forming the anode electrode of the transfer diode D is provided on the exposed AlGaAs layer 18B.

The transfer diode D is formed by the p-n junction between the p-type AlGaAs layer 18C and the n-type AlGaAs layer 20A. Further, the parasitic thyristor P is formed by the p-n-p-n junction between the p-type AlGaAs layer 18A, the n-type AlGaAs layer 16A, the p-type AlGaAs layer 14A, and the n-type AlGaAs layer 12A. The p-type AlGaAs layer 18B is a contact layer between the p-type AlGaAs layer 18A and the electrode 34.

For the shift thyristor T and the light-emitting thyristor L of the semiconductor light-emitting device according to the present embodiment, the same configuration as those of the semiconductor light-emitting device according to the first embodiment are applicable.

As described above, according to the present embodiment, it is possible to suppress the parasitic thyristor P connected to the transfer diode D from being turned on and stably perform a transfer operation in the on-state of the shift thyristor T.

Third Embodiment

Figure 11:
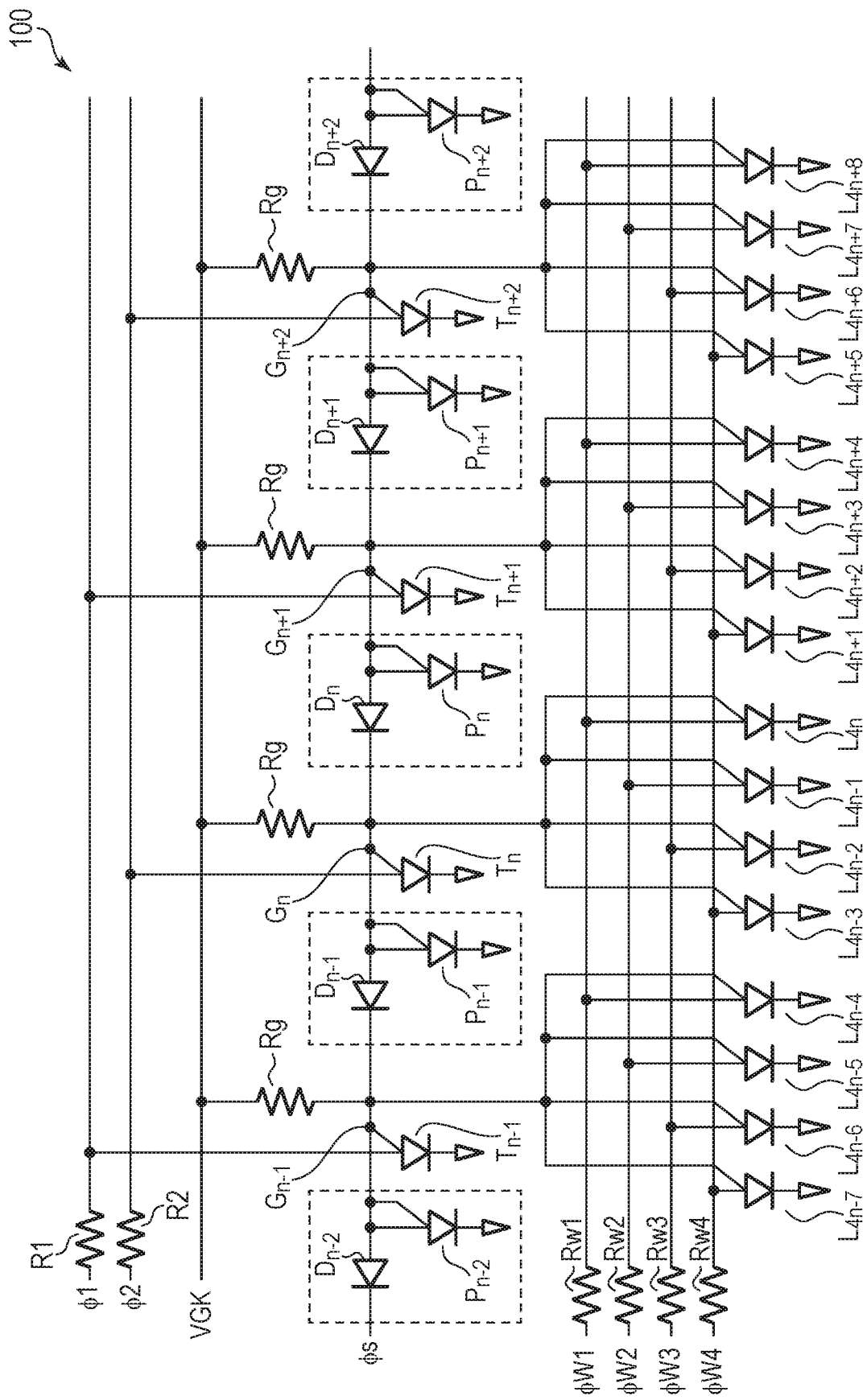
FIG. 11 is an equivalent circuit diagram illustrating a general configuration of a semiconductor light-emitting device according to a third embodiment of the present invention.

A semiconductor light-emitting device according to a third embodiment of the present invention will be described with reference to FIG. 11 to FIG. 12C. The same components as those of the semiconductor light-emitting device according to the first and second embodiments are labeled with the same references, and the description thereof will be omitted or simplified. FIG. 11 is an equivalent circuit diagram illustrating a general configuration of the semiconductor light-emitting device according to the present embodiment. FIG. 12A to FIG. 12C are schematic diagrams illustrating the structure of a transfer diode of the semiconductor light-emitting device according to the present embodiment.

The semiconductor light-emitting device 100 according to the present embodiment is the same as the semiconductor light-emitting device according to the first embodiment except that the gate and the anode of each parasitic thyristor P connected to each transfer diode D are connected to each other. That is, while the gates of the parasitic thyristors P are opened in the semiconductor light-emitting device according to the first embodiment, the gates of the parasitic thyristors P are connected to the anodes of the parasitic thyristors P as illustrated in FIG. 11 in the semiconductor light-emitting device 100 according to the present embodiment.

In the first embodiment, the gate of each parasitic thyristor P is opened to increase the on-voltage VBO and suppress the parasitic thyristor P from operating. However, since the gate of each parasitic thyristor P is opened, that is, in a floating state, the potential thereof may change due to electrostatic induction or the like, and the parasitic thyristor P is likely to be turned on at a low voltage.

By short-circuiting the anode and the gate of each parasitic thyristor P as with the present embodiment, since the gate is maintained at the same potential as the anode even when disturbance is applied to the anode of the parasitic thyristor P, it is possible to prevent the parasitic thyristor P from being turned on due to disturbance or the like. Accordingly, it is possible to provide a more stable transfer operation in the on-state. Note that the operation of the semiconductor light-emitting device according to the present embodiment is the same as the operation of the semiconductor light-emitting device according to the first embodiment.

Figure 12A:
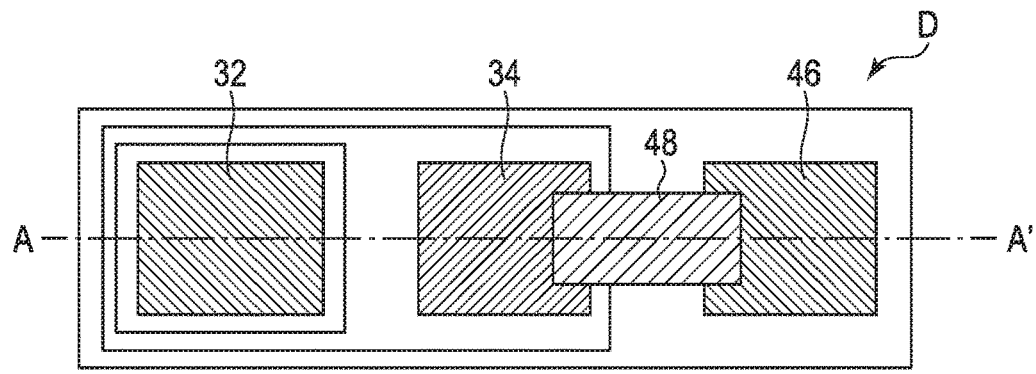
FIG. 12A, FIG. 12B and FIG. 12C are schematic diagrams illustrating a semiconductor element forming a transfer diode portion of the semiconductor light-emitting device according to the third embodiment of the present invention.
Figure 12B:
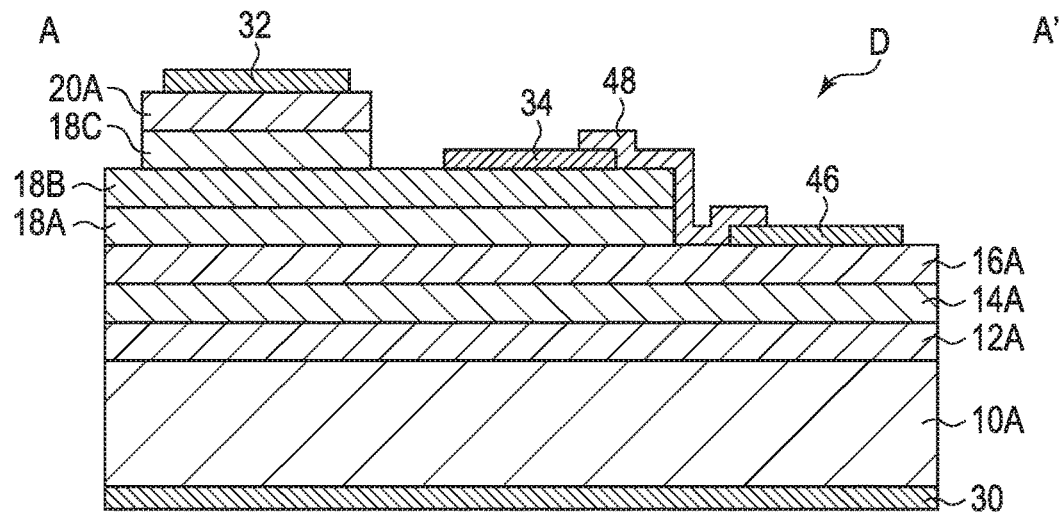
Figure 12C:
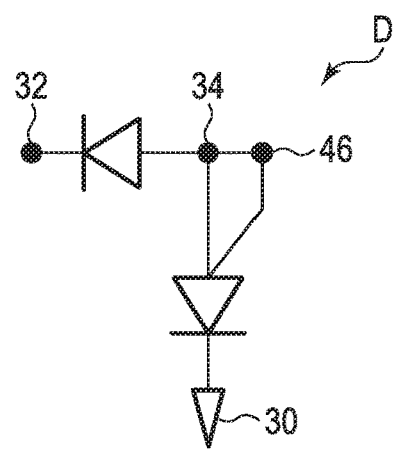

FIG. 12A to FIG. 12C are schematic diagrams illustrating one example of a semiconductor element forming a transfer diode portion of the semiconductor light-emitting device according to the present embodiment. FIG. 12A is a plan view, FIG. 12B is a cross-sectional view taken along a line A-A' of FIG. 12A, and FIG. 12C is an equivalent circuit diagram of the transfer diode D.

The n-type AlGaAs layer 12A, the p-type AlGaAs layer 14A, and the n-type AlGaAs layer 16A are provided over the n-type GaAs substrate 10A. The p-type AlGaAs layer 18A and the p-type AlGaAs layer 18B are provided over the AlGaAs layer 16A. The p-type AlGaAs layer 18C and the n-type AlGaAs layer 20A are provided over the AlGaAs layer 18B. The stacked structure of the semiconductor layers in the transfer diode D of the present embodiment is the same as the transfer diode D of the first embodiment.

The electrode 30 is provided on a face of the GaAs substrate 10A that is opposite to the face on which the AlGaAs layer 12A is provided. The electrode 32 forming the cathode electrode of the transfer diode D is provided on the AlGaAs layer 20A. The AlGaAs layers 18A, 18B, 18C, and 20A on the AlGaAs layer 16A have been partially removed, and an electrode 46 forming the gate of the parasitic thyristor P is provided on the exposed AlGaAs layer 16A. Further, the AlGaAs layers 18C and 20A on the AlGaAs layer 18B have been partially removed, and the electrode 34 forming the anode electrode of the transfer diode D is provided on the exposed AlGaAs layer 18B. Further, an interconnection 48 is provided between the electrode 34 and the electrode 46 to electrically connect these electrodes to each other.

The transfer diode D is formed by the p-n junction between the p-type AlGaAs layer 18C and the n-type AlGaAs layer 20A. Further, the parasitic thyristor P is formed by the p-n-p-n junction between the p-type AlGaAs layer 18A, the n-type AlGaAs layer 16A, the p-type AlGaAs layer 14A, and the n-type AlGaAs layer 12A. The p-type AlGaAs layer 18B is a contact layer between the p-type AlGaAs layer 18A and the electrode 34.

For the shift thyristor T and the light-emitting thyristor L of the semiconductor light-emitting device according to the present embodiment, the same configuration as those of the semiconductor light-emitting device according to the first embodiment are applicable.

As described above, according to the present embodiment, it is possible to suppress the parasitic thyristor P connected to the transfer diode D from being turned on and stably perform a transfer operation in the on-state of the shift thyristor T.

Fourth Embodiment

Figure 13:
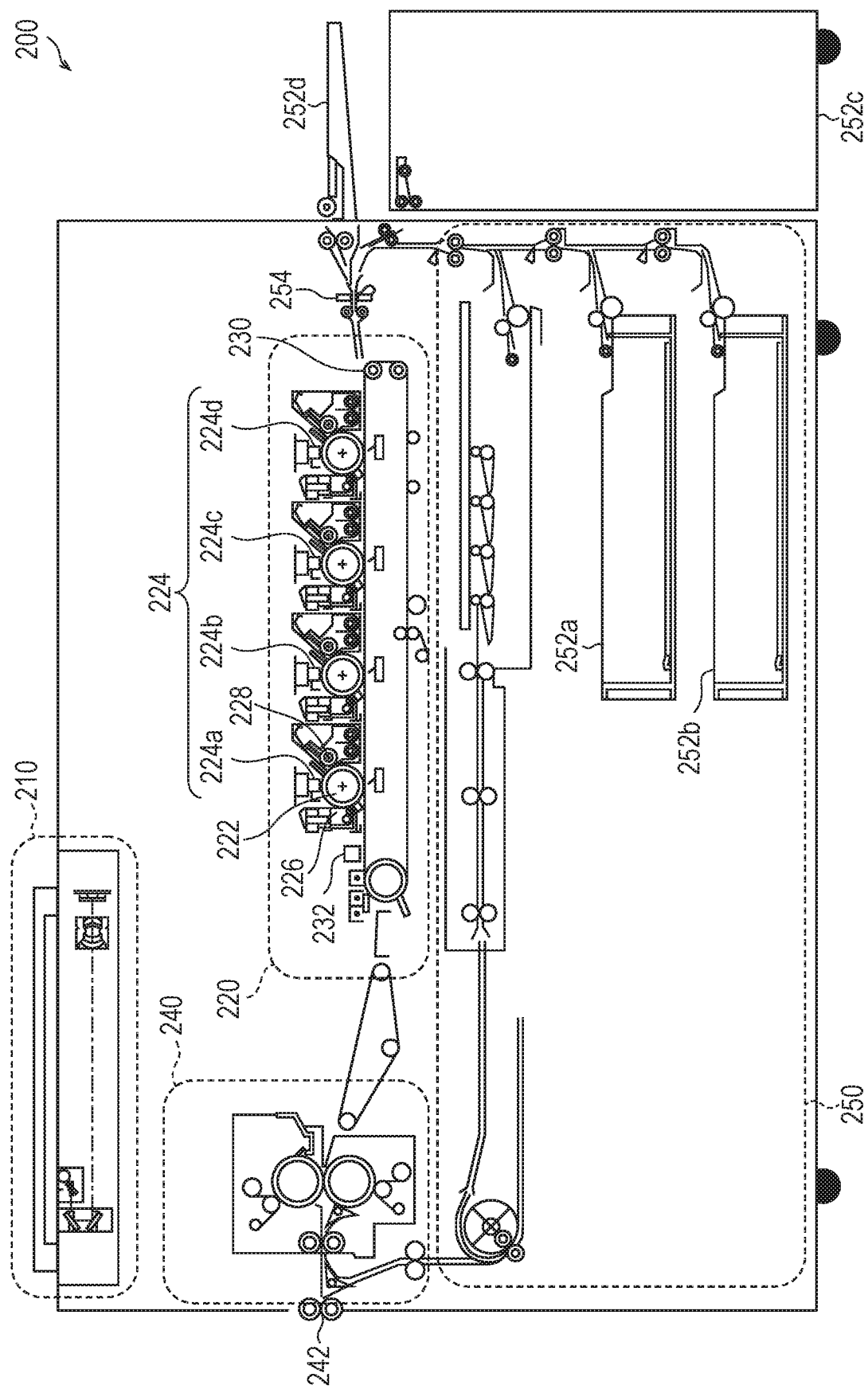
FIG. 13 is a schematic diagram illustrating a configuration example of an image forming apparatus according to a fourth embodiment of the present invention.
Figure 14A:
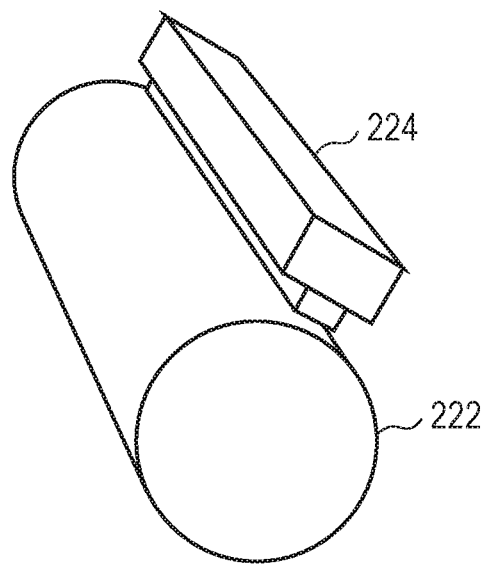
FIG. 14A and FIG. 14B are schematic diagrams illustrating a configuration example of an exposure head of an image forming apparatus according to the fourth embodiment of the present invention.
Figure 14B:
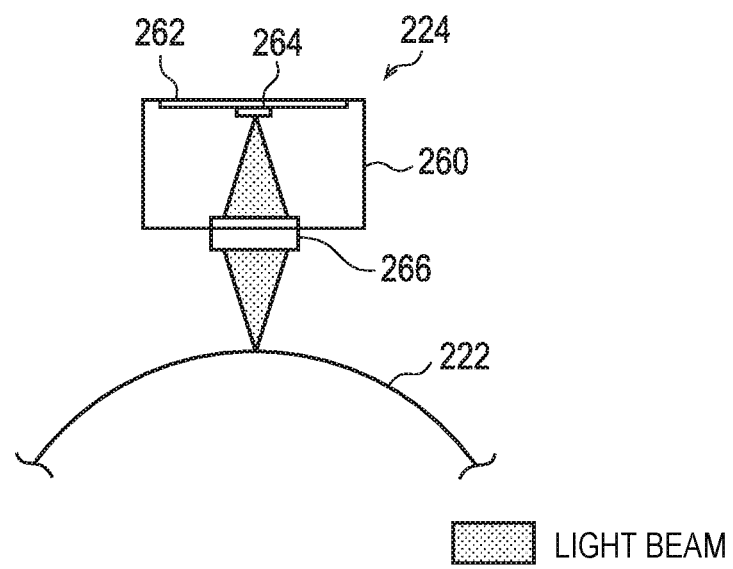
Figure 15A:
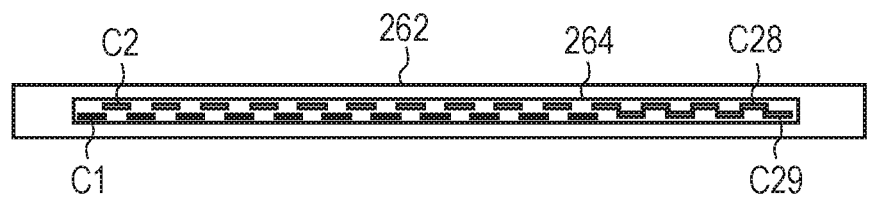
FIG. 15A, FIG. 15B and FIG. 15C are schematic diagrams illustrating a surface light-emitting element array chip group of the image forming apparatus according to the fourth embodiment of the present invention.
Figure 15B:
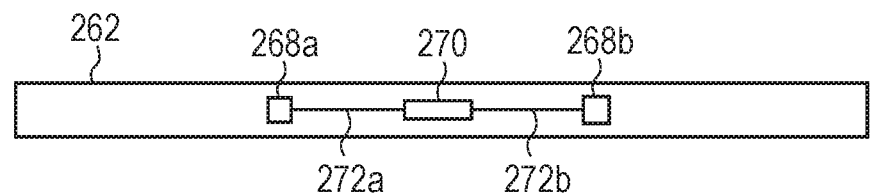
Figure 15C:
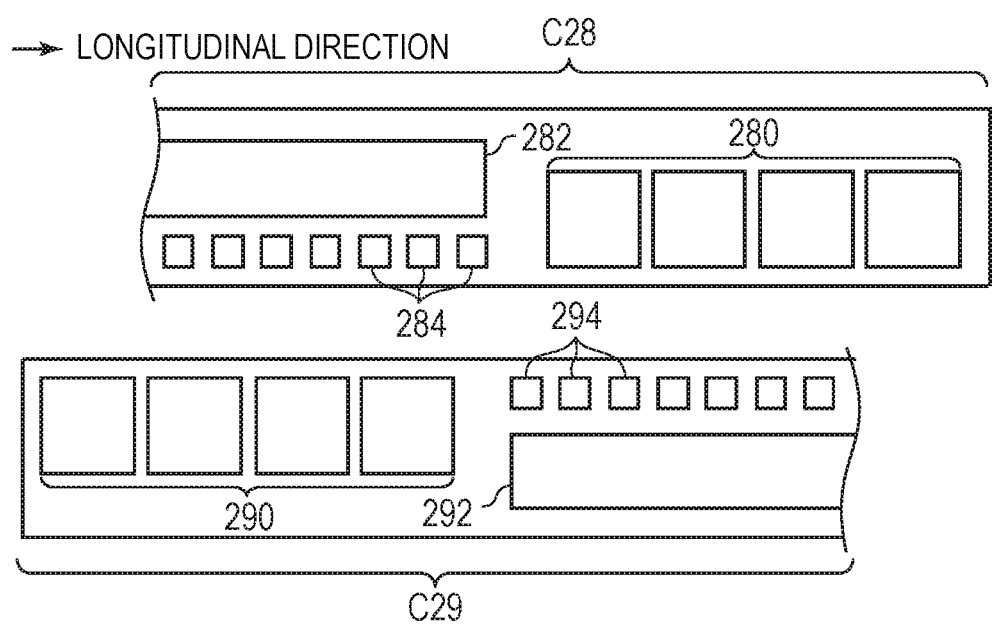

An image forming apparatus according to a fourth embodiment of the present invention will be described with reference to FIG. 13 to FIG. 15C. The same components as those of the semiconductor light-emitting device according to the first to third embodiments are labeled with the same references, and the description thereof will be omitted or simplified. FIG. 13 is a schematic diagram illustrating a configuration example of the image forming apparatus according to the present embodiment. FIG. 14A and FIG. 14B are schematic diagrams illustrating a configuration example of an exposure head of the image forming apparatus according to the present embodiment. FIG. 15A to FIG. 15C are schematic diagrams illustrating a surface light-emitting element array chip group of the image forming apparatus according to the present embodiment.

The semiconductor light-emitting device 100 described as each of the first to third embodiments is applicable to image forming apparatus such as an image scanner, a copy machine, a fax machine, or the like, for example. In the present embodiment, an electrophotographic image forming apparatus will be described as one example of an electronic apparatus using the semiconductor light-emitting device 100 of each of the first to third embodiments.

As illustrated in FIG. 13, an image forming apparatus 200 according to the present embodiment includes a scanner unit 210, an imaging unit 220, a fixing unit 240, a sheet feed/transport unit 250, and an image forming control unit (not illustrated) that controls these components.

The scanner unit 210 emits lighting to a document placed on a document stage to optically read an image of the document and converts the image into an electrical signal to create image data.

The imaging unit 220 includes a plurality of development units that perform development by using an electrophotographic process. Each development unit includes a photosensitive drum 222, an exposure head 224, a charger 226, and a developer 228. The development unit may be a process cartridge accommodating a configuration used for development of a toner image. In such a case, it is preferable that the process cartridge be removable with respect to the main body of the image forming apparatus.

The photosensitive drum 222 is an image carrier on which an electrostatic latent image is formed. The photosensitive drum 222 is rotary-driven and charged by the charger 226. The exposure head 224 irradiates the photosensitive drum 222 with a light in accordance with the image data and forms an electrostatic latent image on the photosensitive drum 222.

The developer 228 supplies a toner (development agent) to an electrostatic latent image formed on the photosensitive drum 222 to perform development. The toner is accommodated in an accommodation unit. It is preferable that the accommodation unit accommodating a toner be included in the development unit. The developed toner image (development agent image) is transferred on a recording medium such as a sheet transported on a transfer belt 230.

The image forming apparatus of the present embodiment has four development units (development stations) that perform development by using a series of electrophotographic processes and forms a desired image by transferring a toner image from each development unit. The four development units have respective toners of different colors. Specifically, four development units aligned in the order of cyan (C), magenta (M), yellow (Y), and black (K) sequentially perform imaging operations with magenta, yellow, and black after a predetermined period elapses from start of an imaging operation with cyan.

The sheet feed/transport unit 250 feeds a sheet from a sheet feed unit which is instructed in advance out of in-housing sheet feed units 252a and 252b, an external sheet feed unit 252c, and a bypass sheet feed unit 252d. A fed sheet is transported to a registration roller 254.

The registration roller 254 transports a sheet on the transfer belt 230 so that a toner image formed in the imaging unit 220 described above is transferred on the sheet.

An optical sensor 232 is arranged so as to face a face on which a toner image of the transfer belt 230 is transferred and performs position detection of a test chart printed on the transfer belt 230 in order to calculate a color displacement between development units. The color displacement calculated here is transmitted to an image controller unit (not illustrated) and used for correction of an image position of each color. This control enables a full-color toner image without color displacement to be transferred on a sheet.

The fixing unit 240 incorporates a plurality of rollers and a heat source such as a halogen heater, uses heat and pressure to dissolve and fix a toner on a sheet on which a toner image has been transferred from the transfer belt 230, and discharges the sheet out of the image forming apparatus 200 by using a sheet discharge roller 242.

The image forming control unit (not illustrated) is connected to a multifunction printer (MFP) control unit that controls the overall MFP including the image forming apparatus and performs control in accordance with an instruction from the MFP control unit. Further, the image forming control unit provides an instruction so that the entirety can maintain coordination to smoothly operate while managing the states of the scanner unit 210, the imaging unit 220, the fixing unit 240, and the sheet feed/transport unit 250 described above.

The exposure head 224 of the image forming apparatus according to the present embodiment will be described with reference to FIG. 14A and FIG. 14B. FIG. 14A illustrates the arrangement of the exposure head 224 relative to the photosensitive drum 222. FIG. 14B illustrates a view in which a light from the exposure head 224 is captured on the surface of the photosensitive drum 222.

As illustrated in FIG. 14A, the exposure head 224 is arranged so as to face the photosensitive drum 222. Each of the exposure head 224 and the photosensitive drum 222 is attached to the image forming apparatus 200 by an attachment member (not illustrated) for use.

As illustrated in FIG. 14B, the exposure head 224 includes a surface light-emitting element array chip group 264, a printed circuit board 262 on which the surface light-emitting element array chip group 264 is implemented, and a rod lens array 266. Further, the exposure head 224 includes a housing (support member) 260 that supports the rod lens array 266 and the printed circuit board 262.

The rod lens array 266 is an optical system that collects light from the surface light-emitting element array chip group 264. The exposure head 224 collects a light generated from a chip surface of the surface light-emitting element array chip group 264 onto the photosensitive drum 222 by the rod lens array 266 and forms an electrostatic latent image in accordance with image data on the photosensitive drum 222.

It is preferable that the exposure head 224 be configured to perform focus adjustment and light amount adjustment at each spot so that an assembly and adjustment operation is performed for a single exposure head in a factory and a light collecting position is located at an appropriate position when attached to an image forming apparatus. Herein, the components are arranged such that the distance between the photosensitive drum 222 and the rod lens array 266 and the distance between the rod lens array 266 and the surface light-emitting element array chip group 264 form predetermined gaps. Thereby, a light from the exposure head 224 is captured on the photosensitive drum 222. Thus, in focus adjustment, an attachment position of the rod lens array 266 is adjusted so that the distance between the rod lens array 266 and the surface light-emitting element array chip group 264 is a desired value. Further, in light amount adjustment, light-emitting points are sequentially caused to emit light, and the drive current at each light-emitting point is adjusted so that a light collected via the rod lens array 266 is a predetermined light amount.

The exposure head 224 of the present embodiment can be used preferably when exposure is performed on the photosensitive drum 222 to form an electrostatic latent image on the photosensitive drum 222. However, the use of the exposure head 224 is not particularly limited, and the exposure head 224 can also be used as a light source of a line scanner, for example.

The surface light-emitting element array chip group 264 of the image forming apparatus according to the present embodiment will be described with reference to FIG. 15A to FIG. 15C. FIG. 15A to FIG. 15C are diagrams schematically illustrating the printed circuit board 262 on which the surface light-emitting element array chip group 264 is arranged.

FIG. 15A schematically illustrates a face of the printed circuit board 262 on which the surface light-emitting element array chip group 264 is arranged, and the face is a face on which the surface light-emitting element array chip group 264 is mounted (hereinafter, referred to as "surface light-emitting element array mounting face").

As illustrated in FIG. 15A, the surface light-emitting element array chip group 264 is formed of 29 surface light-emitting element array chips C1 to C29 in this example. The surface light-emitting element array chip group 264 is mounted on the surface light-emitting element array mounting face of the printed circuit board 262. The surface light-emitting element array chips C1 to C29 are arranged in two lines in a staggered manner on the printed circuit board 262. Each line of the surface light-emitting element array chips C1 to C29 is arranged along the longitudinal direction of the printed circuit board 262.

Each of the surface light-emitting element array chips C1 to C29 may be formed of the semiconductor light-emitting device 100 disclosed in any of the first to third embodiments. Each of the surface light-emitting element array chips C1 to C29 includes 516 light-emitting points and 516 light-emitting thyristors L corresponding to respective light-emitting points. In each of the surface light-emitting element array chips C1 to C29, the 516 light-emitting thyristors L are aligned one-dimensionally at a predetermined pitch in the longitudinal direction of the chip. Adjacent light-emitting thyristors L are isolated by an element isolation groove. That is, the surface light-emitting element array chips C1 to C29 can be referred to as a light-emitting thyristor array in which a plurality of light-emitting thyristors L are aligned one-dimensionally. In this example, the pitch between adjacent light-emitting thyristors is 21.16 µm, which corresponds to the pitch of resolution of 1200 dpi. Further, the distance between both ends of the 516 light-emitting points in the chip is around 10.9 mm (≅21.16 µm×516).

FIG. 15B is a diagram schematically illustrating a face of the printed circuit board 262 on the opposite side of the surface light-emitting element array mounting face (hereinafter, referred to as "surface light-emitting element array non-mounting face").

As illustrated in FIG. 15B, a drive unit 268a that drives the surface light-emitting element array chips C1 to C15 and a drive unit 268b that drives the surface light-emitting element array chips C16 to C29 are arranged on both sides of a connector 270 on the surface light-emitting element array non-mounting face. Signal lines that control the drive units 268a and 268b from an image controller unit (not illustrated), a power supply, and a ground line are connected to the connector 270. Further, the drive units 268a and 268b on the surface light-emitting element array non-mounting face are connected to the connector 270 via interconnections 272a and 272b, respectively. Interconnections used for driving the surface light-emitting element array chips pass through an internal layer of the printed circuit board 262 from the drive units 268a and 268b and are connected to the surface light-emitting element array chips C1 to C15 and the surface light-emitting element array chips C16 to C29, respectively.

FIG. 15C illustrates a view of the boundary part between the surface light-emitting element array chip C28 and the surface light-emitting element array chip C29.

Wire bonding pads 280 and 290 used for inputting control signals are arranged at the ends of the surface light-emitting element array chips C28 and C29, respectively. Transfer units 282 and 292 of the surface light-emitting element array chips C28 and C29 and the light-emitting thyristors 284 and 294 are driven by signals input from the wire bonding pads 280 and 290, respectively. Also in the boundary part between the surface light-emitting element array chips, the pitch in the longitudinal direction of the light-emitting thyristors 284 and 294 is 21.16 µm corresponding to the pitch of resolution of 1200 dpi. Light-emitting thyristors of respective chips may be arranged to overlap each other in plan view taking mounting accuracy of chips into consideration.

Since the 29 surface light-emitting element array chips C1 to C29 having 516 light-emitting points per chip are aligned on the printed circuit board 262, the number of light-emitting thyristors L that can be caused to emit light is 14,964 in the overall surface light-emitting element array chip group 264. Further, the width where exposure is made by the surface light-emitting element array chip group 264 of this example is around 316 mm (≅10.9 mm×29). With a use of the exposure head on which the surface light-emitting element array chip group 264 is mounted, it is possible to form an image corresponding to such a width.

In the image forming apparatus of the present embodiment, since the number of components to be used is small, this facilitates reduction in size or reduction in cost of the apparatus compared to a laser scanning type image forming apparatus that polarizes and scans a laser beam by using a polygon motor.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

Further, although four light-emitting thyristors L are connected to one shift thyristor T and the four light-emitting thyristors L are enabled to simultaneously emit light in the embodiments described above, the number of light-emitting thyristors L enabled to simultaneously emit light is not limited to four.

Further, although the shift thyristor T, the light-emitting thyristor L, and the parasitic thyristor P have been described with an example of n-gate type thyristors in the above embodiments, these thyristors may be formed of p-gate type thyristors. In such a case, the conductivity types of respective semiconductor layers forming the shift thyristor T, the light-emitting thyristor L, the parasitic thyristor P, and the transfer diode D are opposite.

Further, in the above embodiments, GaAs-based compound semiconductor materials containing at least Ga as a group III element and at least As as a group V element have been illustrated as an example for group III-V compound semiconductors forming the semiconductor light-emitting device. However, an InP-based compound semiconductor material containing at least In as a group III element and at least P as a group V element may be used as a group III-V compound semiconductors forming the semiconductor light-emitting device. Further, not only a group III-V compound semiconductor but also a group IV semiconductor or a group II-VI compound semiconductor may be used to form the semiconductor light-emitting device. Further, the composition, the thickness, the impurity concentration, or the like of a material forming the semiconductor layer described in the above embodiments are preferable examples and can be changed as appropriate.

Further, when the transfer diode portion, the shift thyristor portion, and the light-emitting thyristor portion are integrated on the same substrate, a distributed Bragg reflector layer (DBR layer) may be provided between the GaAs substrate 10A and the AlGaAs layer 12A in order to increase optical output of the light-emitting thyristor L. For example, the DBR layer can be configured to alternatingly stack AlGaAs layers of high Al composition and AlGaAs layers of low Al composition so that the optical length of each layer is $\lambda/4$. As a combination of the AlGaAs layer of the high Al composition and the AlGaAs layer of the low Al composition, a combination of $Al_{0.8}Ga_{0.2}As$ and $Al_{0.2}Ga_{0.8}As$ or a combination of $Al_{0.9}Ga_{0.1}As$ and $Al_{0.1}Ga_{0.9}As$ can be preferably used, for example. With respect to the DBR layer, since a larger number thereof allows a higher reflectivity, it is preferable to form a stacked layers having around 20 layers or more.

Further, to increase light emission efficiency of the light-emitting thyristor L, the AlGaAs layer 16A or the AlGaAs layer 14A that is to be a light-emitting portion may be of multi-quantum well (MQW) structure.

Further, the image forming apparatus illustrated in the above fourth embodiment is an example of an image forming apparatus to which the semiconductor light-emitting device of the present invention may be applied, and image forming apparatuses to which the semiconductor light-emitting device of the present invention is applicable are not limited to the configuration illustrated in FIG. 13. Further, the semiconductor light-emitting device of the present invention is applicable to various electronic apparatuses using a semiconductor light-emitting device without being limited to the image forming apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-044642, filed Mar. 12, 2019, which is hereby incorporated by reference herein in its entirety.

What is claimed is:

1. A semiconductor light-emitting device comprising a plurality of nodes and a plurality of transfer diodes connecting the plurality of nodes, a gate of a shift thyristor and a gate of a light-emitting thyristor being connected to each of the plurality of nodes,
    wherein each of the plurality of transfer diodes includes a stacked structure including
        a first semiconductor layer of a first conductivity type provided over a semiconductor substrate,
        a second semiconductor layer of a second conductivity type, which is different from the first conductivity type, provided over the first semiconductor layer,
        a third semiconductor layer of the first conductivity type provided over the second semiconductor layer,
        a fourth semiconductor layer of the second conductivity type provided over the third semiconductor layer, and
        a fifth semiconductor layer of the first conductivity type provided over the fourth semiconductor layer, and
    wherein a p-n junction diode comprised of the fourth semiconductor layer and the fifth semiconductor layer that form a p-n junction is provided.

2. The semiconductor light-emitting device according to claim 1, wherein the fourth semiconductor layer includes a first layer provided over the third semiconductor layer and a second layer provided over the first layer and having a higher impurity concentration than the first layer.

3. The semiconductor light-emitting device according to claim 2, wherein the fourth semiconductor layer further includes a third layer provided over the second layer and having a lower impurity concentration than the second layer.

4. The semiconductor light-emitting device according to claim 3, wherein the fifth semiconductor layer is thicker than the third layer of the fourth semiconductor layer.

5. The semiconductor light-emitting device according to claim 2 further comprising a first electrode connected to the fifth semiconductor layer and a second electrode connected to the second layer of the fourth semiconductor layer.

6. The semiconductor light-emitting device according to claim 5 further comprising a third electrode connected to the third semiconductor layer.

7. The semiconductor light-emitting device according to claim 6 further comprising an interconnection connecting the second electrode and the third electrode to each other.

8. The semiconductor light-emitting device according to claim 6, wherein the third electrode is connected to a power supply.

9. The semiconductor light-emitting device according to claim 1, wherein the third semiconductor layer is in an electrically floating state.

10. The semiconductor light-emitting device according to claim 1, wherein the shift thyristor and the light-emitting thyristor are formed by a p-n-p-n junction made of the first semiconductor layer, the second semiconductor layer, the third semiconductor layer, and the fourth semiconductor layer.

11. An exposure head comprising:
the semiconductor light-emitting device according to claim 1; and
an optical system that collects a light from the semiconductor light-emitting device.

12. An image forming apparatus comprising:
an image carrier;
a charging unit that charges a surface of the image carrier;
an exposure head that includes the semiconductor light-emitting device according to claim 1 and exposes a surface of the image carrier charged by the charging unit to form an electrostatic latent image on the surface of the image carrier;
a development unit that develops the electrostatic latent image formed by the exposure head; and
a transfer unit that transfers an image developed by the development unit onto a recording medium.

13. A semiconductor element comprising:
a stacked structure including
a first semiconductor layer of a first conductivity type provided over a semiconductor substrate,
a second semiconductor layer of a second conductivity type, which is different from the first conductivity type, provided over the first semiconductor layer,
a third semiconductor layer of the first conductivity type provided over the second semiconductor layer,
a fourth semiconductor layer of the second conductivity type provided over the third semiconductor layer, and
a fifth semiconductor layer of the first conductivity type provided over the fourth semiconductor layer,
wherein a p-n junction diode comprised of the fourth semiconductor layer and the fifth semiconductor layer that form a p-n junction is provided.

14. A semiconductor element comprising:
a first semiconductor layer of a first conductivity type provided over a semiconductor substrate;
a second semiconductor layer of a second conductivity type, which is different from the first conductivity type, provided over the first semiconductor layer;
a third semiconductor layer of the first conductivity type provided over the second semiconductor layer;
a fourth semiconductor layer of the second conductivity type provided over the third semiconductor layer;
a fifth semiconductor layer of the first conductivity type provided over the fourth semiconductor layer, the fifth semiconductor layer forming a p-n junction with the fourth semiconductor layer;
a first electrode connected to the fifth semiconductor layer; and
a second electrode connected to the fourth semiconductor layer.

15. The semiconductor element according to claim 14 further comprising a third electrode connected to the third semiconductor layer.

* * * * *